United States Patent
Lim et al.

(10) Patent No.: US 10,665,302 B2
(45) Date of Patent: *May 26, 2020

(54) NON-VOLATILE MEMORY DEVICE AND OPERATING METHOD THEREOF

(71) Applicant: SAMSUNG ELECTRONICS CO., LTD., Suwon-si, Gyeonggi-Do (KR)

(72) Inventors: Bong-Soon Lim, Seoul (KR); Sang-Hyun Joo, Suwon-si (KR); Kee-Ho Jung, Suwon-si (KR)

(73) Assignee: Samsung Electroncis Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/297,763

(22) Filed: Mar. 11, 2019

(65) Prior Publication Data
US 2019/0206497 A1 Jul. 4, 2019

Related U.S. Application Data

(63) Continuation-in-part of application No. 15/405,339, filed on Jan. 13, 2017, now Pat. No. 10,402,247.

(30) Foreign Application Priority Data

Jan. 15, 2016 (KR) .......................... 10-2016-0005330

(51) Int. Cl.
*G11C 16/00* (2006.01)
*G11C 16/16* (2006.01)
(Continued)

(52) U.S. Cl.
CPC .............. *G11C 16/16* (2013.01); *G11C 16/00* (2013.01); *G11C 16/08* (2013.01); *G11C 16/24* (2013.01);
(Continued)

(58) Field of Classification Search
CPC ............ G11C 16/3459; G11C 11/5642; G11C 11/5635; G11C 11/5628
See application file for complete search history.

(56) References Cited

U.S. PATENT DOCUMENTS 6,813,214 B2 11/2004 Cho et al.
7,242,615 B2 7/2007 Nagashima
(Continued)

FOREIGN PATENT DOCUMENTS

JP 5284737 B2 9/2013
KR 1020100089508 A 8/2010
(Continued)

*Primary Examiner* — Mohammed A Bashar
(74) *Attorney, Agent, or Firm* — Volentine, Whitt & Francos, PLLC

(57) ABSTRACT

An operating method of a nonvolatile memory device including a page buffer array in which a plurality of page buffers are arranged in a matrix form includes counting fail bits stored in the page buffers included in first columns determined based on an operation mode from among a plurality of columns of the page buffer array, and determining whether or not a program has passed with respect to memory cells to which the page buffer array is connected, based on a count result corresponding to a number of the fail bits and a reference count determined based on the operation mode.

20 Claims, 36 Drawing Sheets

(51) Int. Cl.
    *G11C 16/34*         (2006.01)
    *H01L 27/11582*    (2017.01)
    *G11C 16/24*         (2006.01)
    *G11C 16/08*         (2006.01)

(52) U.S. Cl.
    CPC .... *G11C 16/3459* (2013.01); *H01L 27/11582* (2013.01)

(56) References Cited

U.S. PATENT DOCUMENTS

| | | |
|---|---|---|
| 7,428,180 B2 | 9/2008 | Kim |
| 7,952,958 B2 | 5/2011 | Yanagidaira et al. |
| 8,270,215 B2 | 9/2012 | You et al. |
| 8,508,992 B2 | 8/2013 | Park |
| 8,625,355 B2 | 1/2014 | Chokan et al. |
| 8,879,351 B2 | 11/2014 | Kim |
| 9,036,412 B2 | 5/2015 | Choi et al. |
| 2010/0034025 A1 | 2/2010 | Yanagidaira et al. |
| 2010/0329030 A1 | 12/2010 | You et al. |
| 2011/0051514 A1* | 3/2011 | Han .................. G06F 11/1048 365/185.09 |
| 2012/0314500 A1 | 12/2012 | Song et al. |
| 2013/0336057 A1 | 12/2013 | Chung et al. |

FOREIGN PATENT DOCUMENTS

| | | |
|---|---|---|
| KR | 101039962 B1 | 6/2011 |
| KR | 1020140014547 A | 2/2014 |

\* cited by examiner

FIG. 21

| COLUMN SAMPLING RATIO | Max Count bit |
|---|---|
| N/(A+B+C) | k * M * (N/(A+B+C)) |
| N/(B+C) | k * M * (N/(B+C)) |
| N/C | k * M * (N/C) |
| N/(A+B) | k * M * (N/(A+B)) |
| N/B | k * M * (N/B) |
| N/A | k * M * (N/A) |

FIG. 28

| OPM | CNS (S[3:1]) | Reference Count | RC2/RC1 (m) |
|---|---|---|---|
| OP1 (SLC PGM) | 001 | RCT1 | 4 |
| OP2 (MLC PGM) | 010 | RCT2 | 2 |
| OP3 (TLC PGM) | 111 | RCT3 | 1 |

US 10,665,302 B2

NON-VOLATILE MEMORY DEVICE AND OPERATING METHOD THEREOF

CROSS-REFERENCE TO RELATED APPLICATION

This is a Continuation-In-Part of U.S. patent application Ser. No. 15/405,339, filed on Jan. 13, 2017, the disclosure of which is incorporated herein in its entirety by reference. Further, a claim of priority under 35 U.S.C. § 119 is made to Korean Patent Application No. 10-2016-0005330, filed on Jan. 15, 2016, in the Korean Intellectual Property Office, the disclosure of which is incorporated herein in its entirety by reference.

BACKGROUND

Field of the Disclosure

The present disclosure relates to a memory device. More particularly, the present disclosure relates to a non-volatile memory and a method of operating the same.

Background Information

Memory devices are used to store data and may be classified into volatile memory devices and non-volatile memory devices. As an example of a non-volatile memory, a flash memory device may be used in a mobile phone, a digital camera, a personal digital assistant (PDA), a portable computer, device, a fixed computer device, and the like.

SUMMARY

The present disclosure describes a non-volatile memory that may improve program speed, and a method of operating the same.

The present disclosure also describes a non-volatile memory that may improve fail bit counting performance of a bit counter, and a method of operating the same.

According to an aspect of the inventive concept, an operating method of a nonvolatile memory device including a page buffer array in which a plurality of page buffers are arranged in a matrix form includes counting fail bits stored in the page buffers included in first columns determined based on an operation mode from among a plurality of columns of the page buffer array, and determining whether or not a program has passed with respect to memory cells to which the page buffer array is connected, based on a count result corresponding to the number of the fail bits and a reference count determined based on the operation mode.

According to another aspect of the inventive concept, an operating method of a nonvolatile memory device includes applying, to a word line of a memory cell array, a first program voltage for programming a plurality of memory cells connected to the word line to an nth program state (n is a positive integer), performing a first verification operation corresponding to the operation of applying the first program voltage, counting, based on a reference current, fail bits stored in page buffers included in L (L is a positive integer equal to or less than N) columns predetermined based on a write mode, from among N (N is a positive integer) columns of a page buffer array connected to the plurality of memory cells, and determining, based on a count result corresponding to the number of the fail bits and a reference count determined based on the write mode, whether a program has passed or not with respect to the plurality of memory cells.

According to another aspect of the inventive concept, a nonvolatile memory device includes a memory cell array including memory cells, a page buffer array in which a plurality of page buffers are arranged in a matrix form and which is configured to generate a plurality of page buffer signals according to a result of a verification read operation on the memory cells, a page buffer decoding unit configured to generate a decoder output signal corresponding to the number of fail bits from page buffer signals, from among the plurality of page buffer signals, the page buffer signals being received from first columns determined based on an operation mode from among a plurality of columns of the page buffer array, a fail bit counter configured to output a count value corresponding to the number of fail bits from the decoder output signal, and a control logic configured to determine whether or not a program has passed with respect to the memory cells, based on the count value, and a reference count determined based on the operation mode.

BRIEF DESCRIPTION OF THE DRAWINGS

Embodiments of the present disclosure will be more clearly understood from the following detailed description taken in conjunction with the accompanying drawings in which:

FIGS. 9A and 9B are graphs for explaining program processes and a program time when 2-bit data is written to memory cells, wherein FIG. 9A shows a comparative example, and FIG. 9B is a graph for explaining a program method and a program time according to an embodiment;

FIG. 21 is a table showing the maximum possible number of fail bits that may be counted according to a column sampling ratio according to a column sampling ratio, according to an embodiment;

FIG. 28 is a diagram of examples of parameters determined according to operation modes in a memory device, according to an embodiment;

DETAILED DESCRIPTION OF THE EMBODIMENTS

Figure 1:
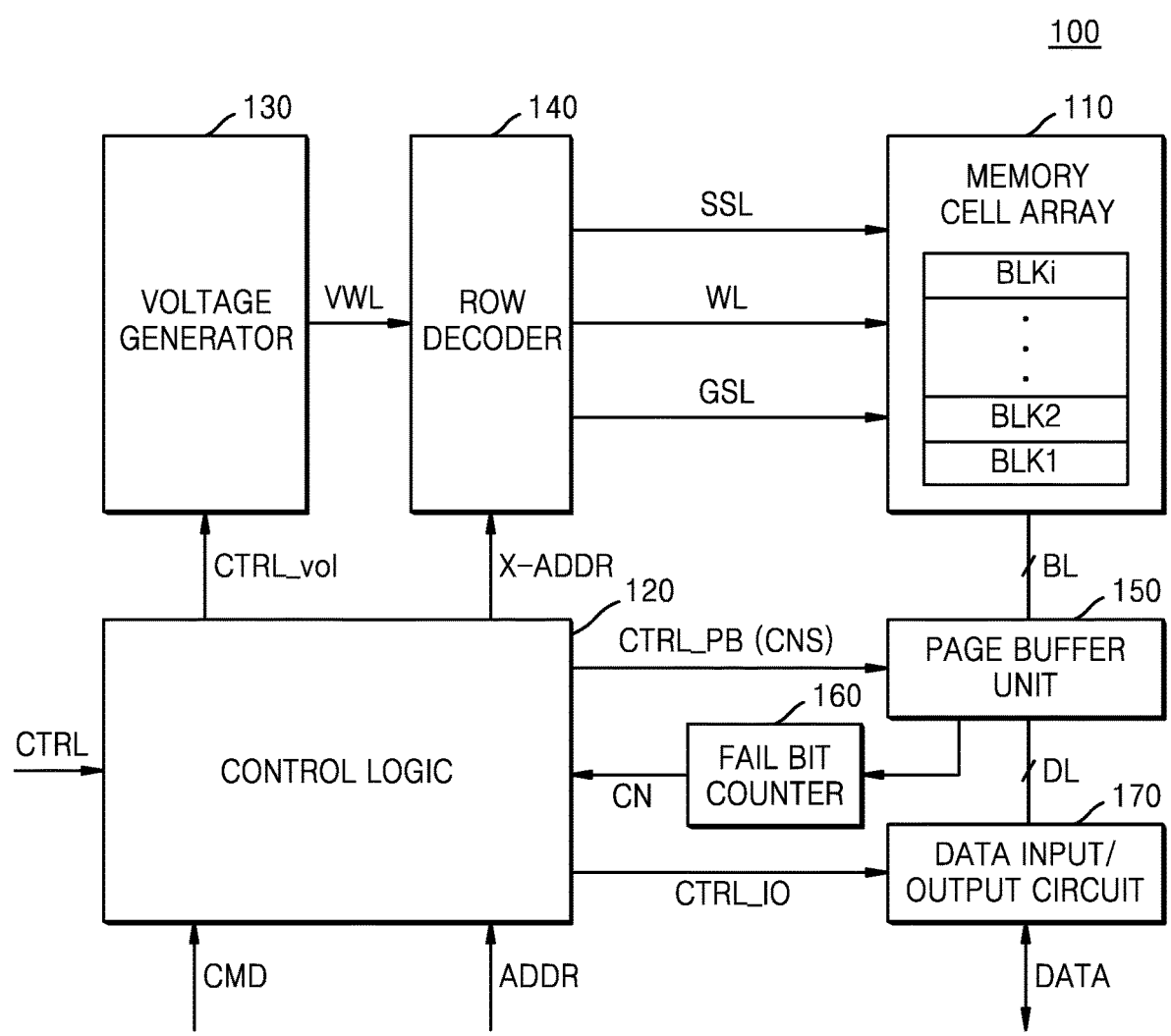
FIG. 1 is a schematic block diagram of a memory device according to an embodiment.

FIG. 1 is a schematic block diagram of a memory device 100 according to an embodiment.

Referring to FIG. 1, the memory device 100 may include a memory cell array 110, a control logic 120, a voltage generator 130, a row decoder 140, a page buffer unit 150, a fail bit counter 160, and a data input/output circuit 170.

The memory cell array 110 may include memory cells. For example, memory cells may be flash memory cells. Hereinafter, a case where the memory cells are NAND flash memory cells will be described. However, the memory cell array 110 is not limited thereto. In another embodiment, the memory cells may be resistive memory cells such as resistive random access memory (RRAM), phase change RAM (PRAM), or magnetic RAM (MRAM).

Memory cell arrays, memory cells and memory described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory cell array, memory cell, or memory described herein is an article of manufacture and/or machine component. Memory cell arrays, memory cells, and memories described herein are computer-readable mediums from which data and executable instructions can be read by a computer.

The memory cell array 110 may be 3-dimensional (3D) memory cell array. The 3D memory cell array 110 may be a monolithic memory cell array in which memory cells are arranged in at least one physical level. The memory cells may have active areas arranged on a silicon substrate and circuits related to operations of the memory cells and are formed on or in the silicon substrate. The term "monolithic" indicates that layers forming the memory cell array are stacked directly above layers of underlying levels of the memory cell array. The 3D memory cell array 110 includes NAND strings vertically arranged in such a manner that at least one memory cell is located above another memory cell. The at least one memory cell may include a charge trap layer. However, the memory cell array 110 is not limited thereto, and in another embodiment, the memory cell array 110 may be a 2D memory cell array.

In the present embodiment, each memory cell included in the memory cell array 110 may be a multi-level cell (MLC) in which data of 2 bits or more is stored. For example, the memory cell may be a multi-level cell in which 2-bit data is stored. As another example, the memory cell may be a triple level cell (TLC) in which 3-bit data is stored or a quadruple level cell (QLC) in which 4-bit data is stored. However, the memory cells and memory cell array 110 are not limited thereto, and in another embodiment, some of the memory cells included in the memory cell array 110 may be single level cells (SLCs) in which 1-bit data is stored, and others thereof may be multi-level cells.

The memory cell array 110 may be connected to word lines WL, string selection lines SSL, ground selection lines GSL, and bit lines BL. In detail, the memory cell array 110 may be connected to the row decoder 140 via the word lines WL or the selection lines, and may be connected to the page buffer unit 150 via the bit lines BL. That is, the memory cell array 110 may be connected to the row decoder 140 via the word lines WL or the string selection lines SSL and the ground selection lines GSL, and may be connected to the page buffer unit 150 via the bit lines BL.

The memory cell array 110 may include memory blocks BLK1 to BLKi. The memory blocks BLK1 to BLKi may include at least one of single level cell blocks including single level cells, multi-level cell blocks including multi-level cells, and triple level cell blocks including triple level cells. In an embodiment, some of the memory blocks BLK1 to BLKi included in the memory cell array 110 may be single level cell blocks, and others thereof may be multi-level cell blocks or triple level cell blocks.

The control logic 120 may output various control signals for writing data to the memory cell array 110. The control logic 120 may also read data from the memory cell array 110 based on a command CMD, an address ADDR, and a control signal CTRL received from the outside, for example, a memory controller (not shown). Thus, the control logic 120 may control various operations performed in the memory device 100 overall.

Various control signals output from the control logic 120 may be provided to the voltage generator 130, the row decoder 140, the page buffer unit 150, the fail bit counter 160, and the data input/output circuit 170. In detail, the control logic 120 may provide a voltage control signal CTRL_vol to the voltage generator 130, a row address X-ADDR to the row decoder 140, and a page buffer control signal CTRL_PB to the page buffer unit 150. Also, the control logic 120 may provide a connection control signal CNS to the fail bit counter 160 and an input/output control signal CTRL_I/O to the data input/output circuit 170. However, the control logic is not limited thereto, and the control logic 120 may provide other control signals to the voltage generator 130, the row decoder 140, the page buffer unit 150, the fail bit counter 160, and the data input/output circuit 170.

According to the present embodiment, the control logic 120 may determine whether a program has passed/failed, and further, whether an additional program process needs to be performed, based on a fail bit value CN provided from the fail bit counter 160. According to the present embodiment, when the fail bit value CN is lower than a threshold value that is set in advance, the memory device 100 may skip a verification operation. The skipped verification operation is to be performed after a program voltage is additionally applied. The memory device 100 may also terminate the program or may determine to execute a program in a next program state.

Also, the control logic 120 may control connection between the fail bit counter 160 and page buffers of the page buffer unit 150 based on an operation mode according to a command CMD received from the outside.

The voltage generator 130 may generate various voltages for performing program, read, and erase operations regarding the memory cell array 110, based on the voltage control signal CTRL_vol. In detail, the voltage generator 130 may generate a word line operation voltage VWL for driving the word lines WL. For example, the word line operation voltage VWL may be a program voltage (or a write voltage), a read voltage, an inhibit voltage, an erase verification voltage, or a program verification voltage. Also, the voltage generator 130 may further generate a string selection line operation voltage for operating the string selection lines SSL and a ground selection line operation voltage for operating the ground selection lines GSL. Also, the voltage generator 130 may further generate an erase voltage to be provided to the memory cell array 110.

The row decoder 140 may select some of the word lines WL in response to the row address X-ADDR received from the control logic 120. In detail, during a read operation, the row decoder 140 may apply a read voltage to the selected word lines and an inhibit voltage to non-selected word lines. Also, during a program operation, the row decoder 140 may apply a program voltage to the selected word lines and an inhibit voltage to the non-selected word lines. Also, the row decoder 140 may select some of the string selection lines SSL or some of the ground selection lines GSL in response to the row address X-ADDR received from the control logic 120.

The page buffer unit 150 may be connected to the memory cell array 110 via the bit lines BL and may perform a program operation, a read operation, or an erase operation in response to the page buffer control signal CTRL_PB received from the control logic 120. In detail, during the read operation, the page buffer unit 150 may function as a sense amplifier and output data DATA stored in the memory cell array 110. During the program operation, the page buffer unit 150 may function as a write driver and input data DATA that is intended to be stored in the memory cell array 110.

The page buffer unit 150 according to the present embodiment may include a page buffer array that includes page buffers arranged in a matrix form. Each page buffer may store program fail bits regarding a memory cell corresponding to the page buffer. In an embodiment, the page buffer unit 150 includes a connection circuit (not shown). The connection circuit may control connection between the fail bit counter 160 and columns included in the page buffer array, based on the connection control signal CNS provided by the control logic 120. The connection control signal CNS may be received from the control logic 120 as the page buffer control signal CTRL_PB. The page buffer unit 150 according to the present embodiment and operations thereof will be described below with reference to FIGS. 11 to 23B.

The fail bit counter 160 may calculate the fail bit value CN by counting fail bits stored in the page buffers of the page buffer unit 150 and may provide the control logic 120 with the calculated fail bit value CN. The fail bit counter 160 may count fail bits stored in page buffers included in some columns selected from among the columns included in the page buffer array. In other words, the fail bit counter 160 may count fail bits stored in page buffers included in some (e.g., fewer than all) columns connected to the fail bit counter 160. The fail bit counter 160 may count fail bits stored in the page buffers of the page buffer array by using a column sampling method and may calculate the fail bit value CN by multiplying the counted number of fail bits and a column sampling ratio. Accordingly, the maximum number of fail bits which may be counted by the fail bit counter 160 may be increased, and the fail bit value CN may reflect an estimate, extrapolation or projection of an actual total.

The data input/output circuit 170 may transmit data DATA input from the outside to the page buffer unit 150 via data lines DL. The data input/output circuit 170 may also transmit data DATA output from the page buffer unit 150 to the outside of the memory device 100, for example, the memory controller (not shown), via input/output pins or a data bus of the memory device 100.

Figure 2:
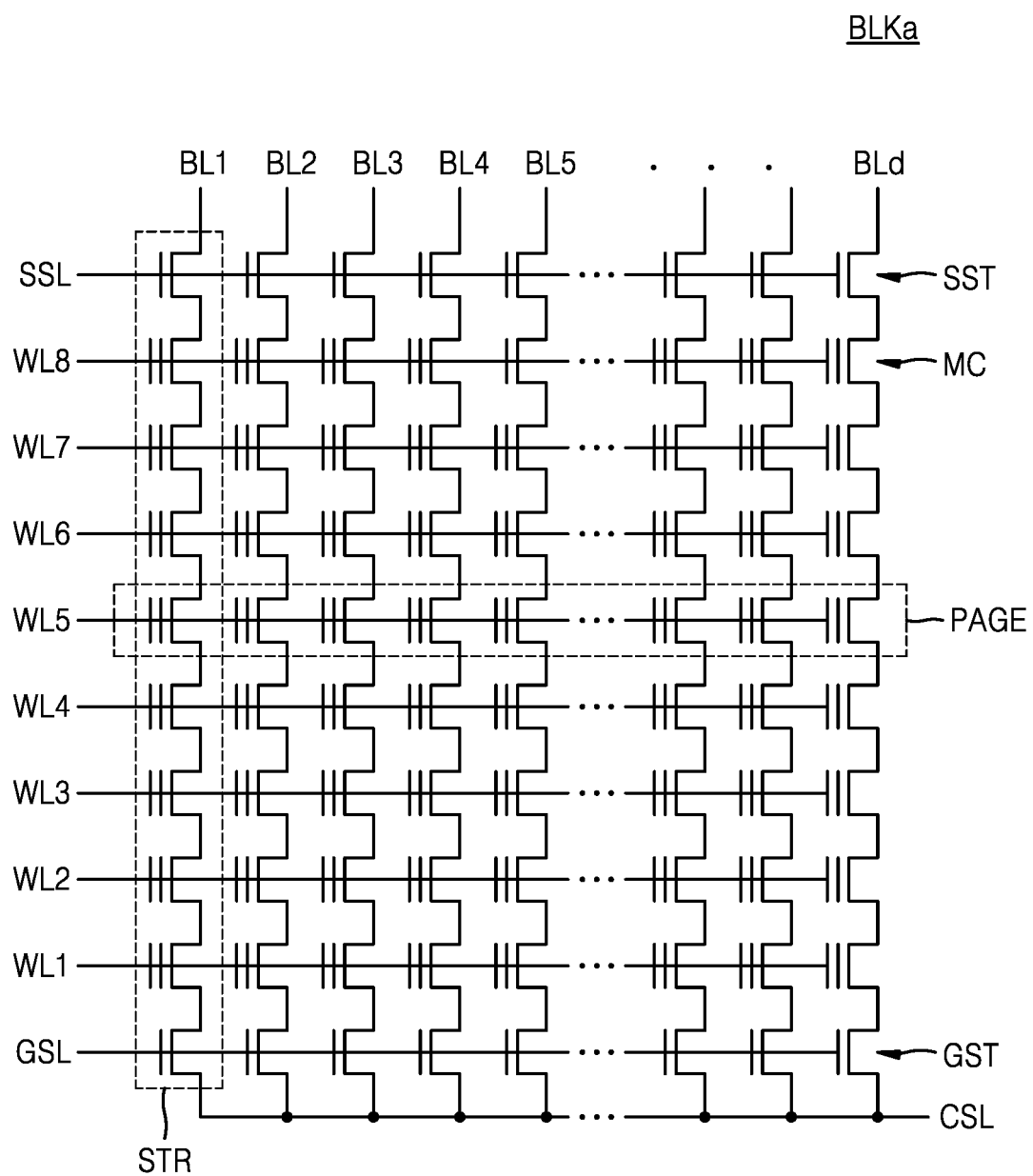
FIG. 2 is a circuit diagram of an example of a memory block according to an embodiment.

FIG. 2 is a circuit diagram of an example of a memory block according to an embodiment.

Referring to FIG. 2, a memory block BLKa may be a NAND flash memory having a horizontal structure. The memory block BLKa may include strings STR connected to memory cells MC in series. Each string STR may include memory cells MC connected to each other in series. Each string STR also may include a string selection transistor SST and a ground selection transistor GST respectively connected to both ends of memory cells MC connected to each other in series. The number of strings STR, the number of word lines WL, and the number of bit lines BL may vary according to embodiments.

A NAND flash memory device including memory blocks having the structure of FIG. 2 is erased in a memory block unit and may execute a program in a unit of a page PAGE corresponding to each word line, that is, each of the word lines WL1 to WL8.

Figure 3:
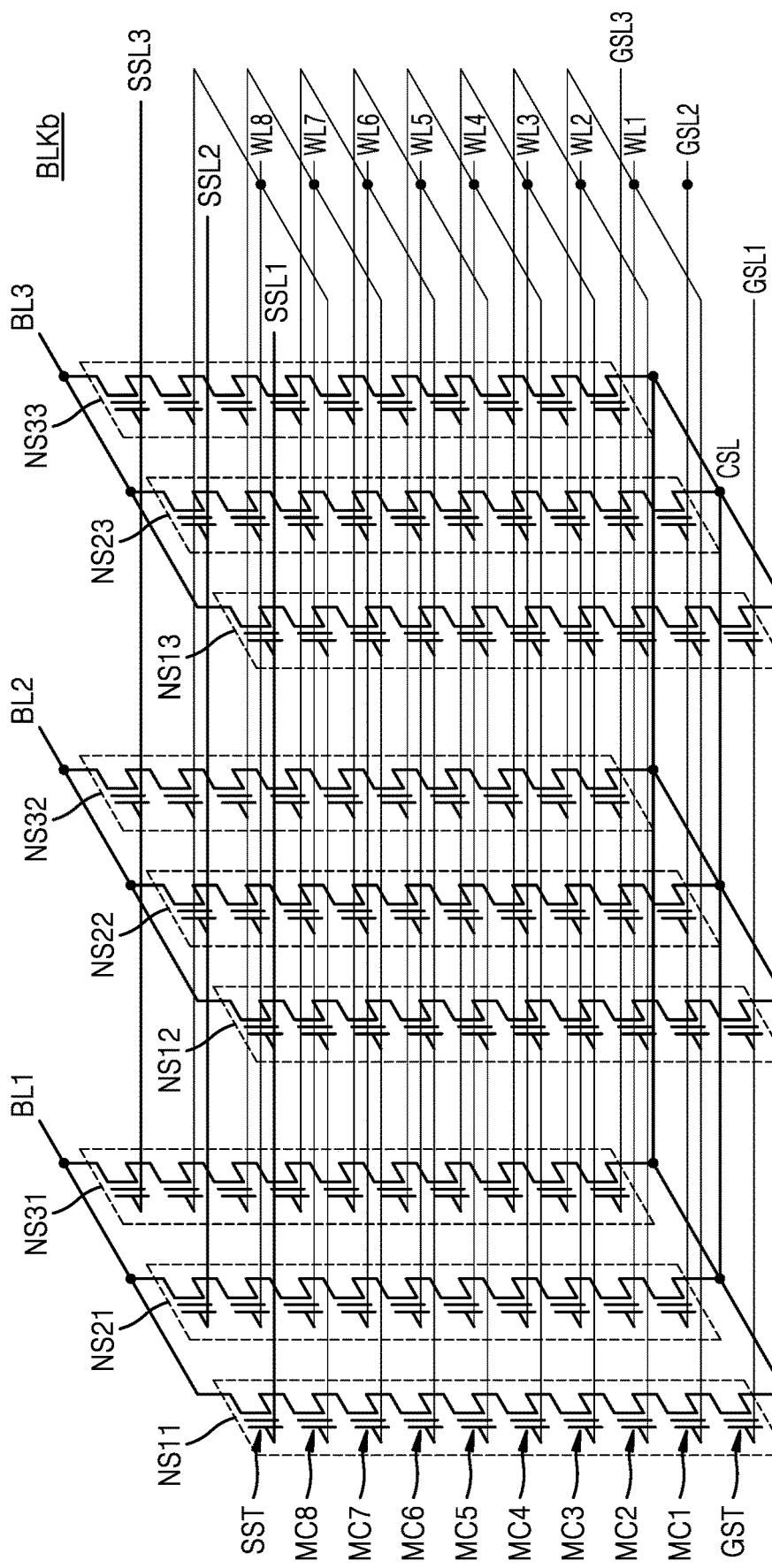
FIG. 3 is a circuit diagram of another example of a memory block according to an embodiment.

FIG. 3 is a circuit diagram of another example of a memory block according to an embodiment.

Referring to FIG. 3, a memory block BLKb may be a NAND flash memory having a vertical structure. The memory block BLKb may include NAND strings NS11 to NS33, first to eighth word lines WL1 to WL8, first to third bit lines BL1 to BL3, ground selection lines GSL1 to GSL3, first to third string selection lines SSL1 to SSL3, and a common source line CSL. The number of NAND strings, the number of word lines, the number of bit lines, the number of ground selection lines, and the number of string selection lines may vary according to embodiments.

The NAND strings NS11, NS21, and NS31 are provided between the first bit line BL1 and the common source line CSL. The NAND strings NS12, NS22, and NS32 are provided between the second bit line BL2 and the common source line CSL. The NAND strings NS13, NS23, and NS33 are provided between the third bit line BL3 and the common source line CSL. Each NAND string (e.g., the NAND string NS11) may include the string selection transistor SST, memory cells MC1 to MC8, and the ground selection transistor GST connected to each other in series. Hereinafter, the NAND strings will be referred to as strings for convenience.

Strings commonly connected to one bit line form one column. For example, the strings NS11, NS21, and NS31 commonly connected to the first bit line BL1 correspond to a first column. The strings NS12, NS22, and NS32 commonly connected to the second bit line BL2 correspond to a second column. The strings NS13, NS23, and NS33 commonly connected to the third bit line BL3 correspond to a third column.

Strings connected to one string selection line form a row. For example, the strings NS11, NS12, and NS13 connected to the first string selection line SSL1 may correspond to a first row. The strings NS21, NS22, and NS23 connected to the second string selection line SSL2 may correspond to a second row. The strings NS31, NS32, and NS33 connected to the third string selection line SSL3 may correspond to a third row.

The string selection transistor SST is connected to the first to third string selection lines SSL1 to SSL3. The memory cells MC1 to MC8 are connected to the word lines WL1 to WL8 respectively corresponding thereto. The ground selection transistor GST is connected to the ground selection lines GSL1 to GSL3. The string selection transistor SST is connected to its corresponding bit lines BL, and the ground selection transistor GST is connected to the common source line CSL.

Figure 4:
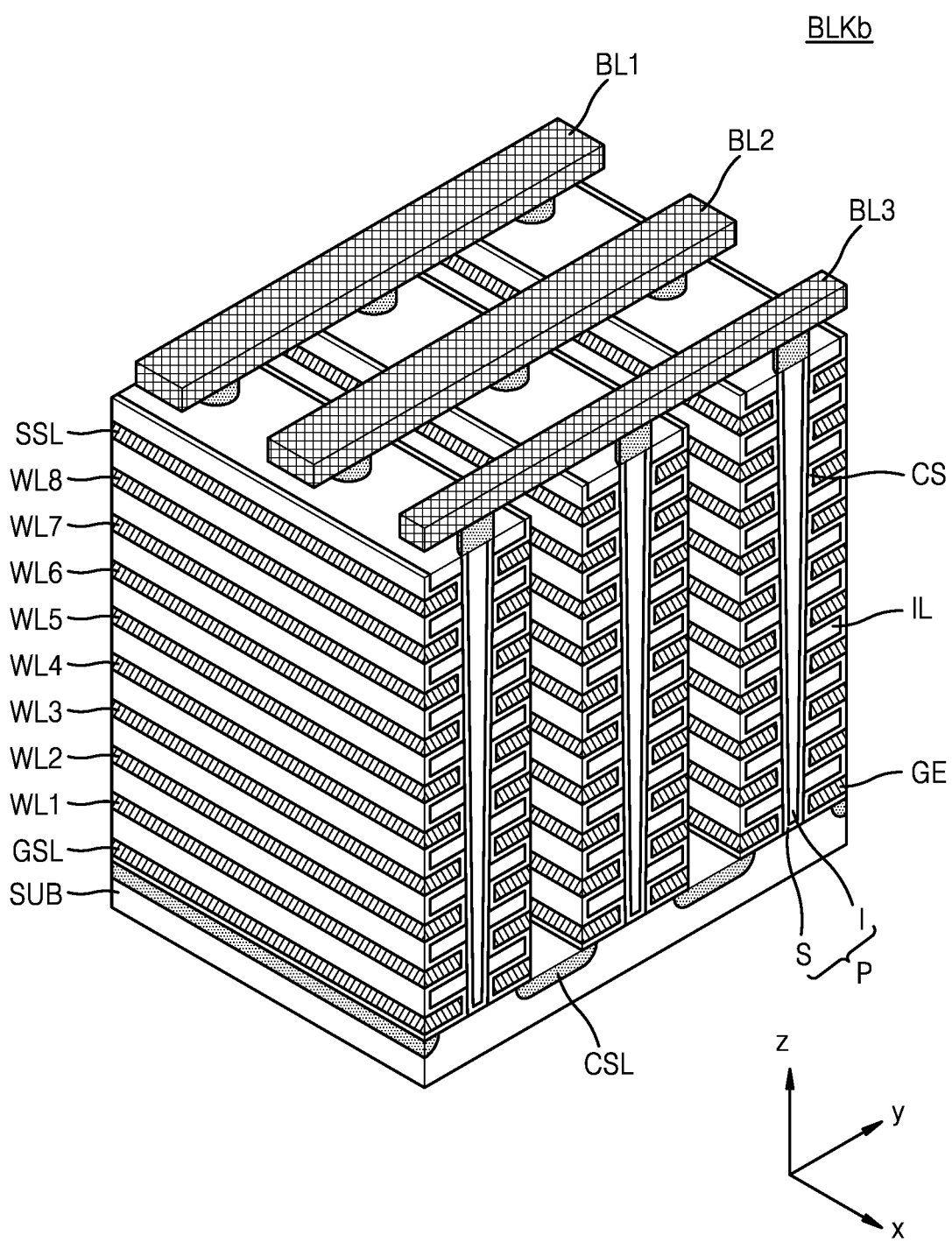
FIG. 4 is a perspective view of the memory block according to the circuit diagram of FIG. 3.

Word lines having a uniform height (e.g., the first word line WL1) are connected to each other, and the first to third string selection lines SSL1 to SSL3 are separated from each other. For example, when memory cells connected to the first word line WL1 and included in the strings NS11, NS12, and NS13 are programmed, the first word line WL1 and the first string selection line SSL1 may be selected. In an embodiment, as shown in FIG. 4, the ground selection lines GSL1 to GSL3 are separated from each other. In another embodiment, the ground selection lines GSL1 to GSL3 may be connected to each other.

FIG. 4 is a perspective view of the memory block BLKb according to the circuit diagram of FIG. 3.

Referring to FIG. 4, the memory block BLKb is vertical with respect to a substrate SUB. The substrate SUB may be a first semiconductor layer 10 of FIG. 1. The substrate SUB may have a first conductive type (e.g., a p type) and may include common source lines CSL extending in a first direction (e.g., an x direction) on the substrate SUB and doped with impurities of a second conductive type (e.g., an n type). The common source line CSL may function as a source area where a current is provided to vertical-type memory cells.

On a region of the substrate SUB between two neighboring common source lines CSL, insulating layers IL extending in a second direction (e.g., a y direction) are sequentially provided in a third direction (e.g., a z direction). The insulating layers IL are spaced apart from one another by a certain distance along the third direction. For example, the insulating layers IL may include an insulating material such as a silicon oxide.

In the region of the substrate SUB between the neighboring common source lines CSL, channel holes that are sequentially arranged in the first direction and penetrate the insulating layers IL in the third direction may be formed. The channel holes may be formed in a cup form (or in a form of a cylinder whose bottom portion is blocked) extending in a vertical direction. Alternatively, the channel holes may be formed in a pillar form as shown in FIG. 4. Hereinafter, the channel holes will be referred to as pillars. The pillars P may penetrate the insulating layers IL and thus may contract the substrate SUB. In detail, a surface layer S of each pillar P may include a silicon material of a first type and may function as a channel area. An internal layer I of each pillar P may include an air gap or an insulating material such as silicon oxide.

On the region of the substrate SUB between the neighboring common source lines CSL, charge storage layers CS are provided along exposed surfaces of the insulating layers IL, the pillars P, and the substrate SUB. For example, the charge storage layer CS may have an oxide-nitride-oxide (ONO) structure. In addition, on the region of the substrate SUB between the neighboring common source lines CSL, a gate electrode GE is provided on a surface of the change storage layer CS which is exposed.

Drains or drain contacts are respectively provided to the pillars P. For example, the drains or the drain contacts may include silicon materials doped with impurities of the second conductive type. On the drains or the drain contacts, bit lines BL that extend in the second direction (e.g., the y direction) and are spaced apart from one another by a certain distance along the first direction may be provided.

An embodiment of a memory block has been described with reference to FIG. 4. However, the memory block is not limited thereto, and a structure of the memory block may vary.

Figure 5:
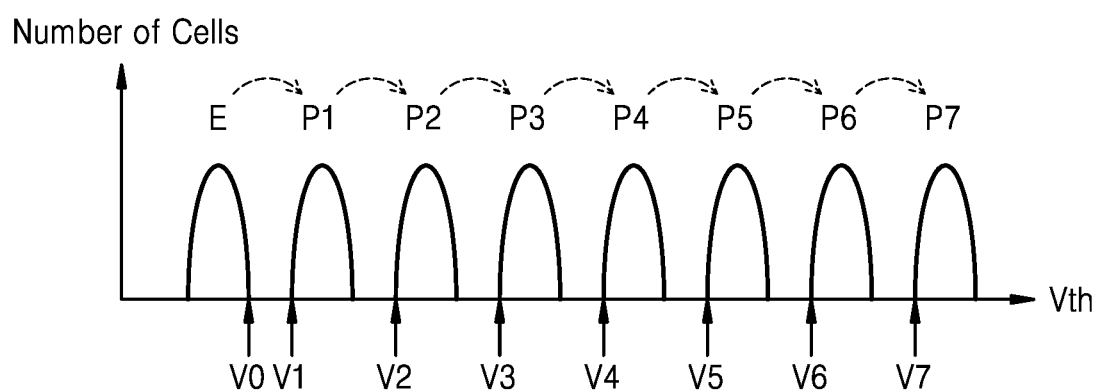
FIG. 5 is a graph showing distributions of threshold voltages of memory cells after writing of data is finished.

FIG. 5 is a graph showing distributions of threshold voltages of memory cells after writing of data is finished. In detail, FIG. 5 shows an example of a triple level cell in which 3-bit data may be stored. Referring to FIG. 5, a horizontal axis indicates a threshold voltage Vth, and a vertical axis indicates the number of memory cells.

Referring to FIG. 5, a memory cell may have one of an erase state E and first to seventh program states P1 to P7. The erase state E and the first to seventh program states P1 to P7 may correspond to different pieces of 3-bit data, respectively. A determination as to which state a memory cell is in among the erase state E and the first to seventh program states P1 to P7 may be made based on a voltage between states that are adjacent to each other, and accordingly, data stored in the memory cell may be determined.

The state of the memory cell may be transited from the erase state E to any one of the first to seventh program states P1 to P7 due to a program voltage (or a program pulse) applied via a word line connected to the memory cell. The threshold voltage Vth of the memory cell may increase (e.g., move in a rightward direction in FIG. 5) based on the program pulse and may have a value corresponding to a desired state after the threshold voltage Vth is verified by first to seventh verification voltages V1 to V7. An operation of writing data to the memory cell may include a program operation of applying program pulses one after the other, and a verification operation.

The memory cell may have an erase state E before data is written, and there may be various program methods used to transit a state of the memory cell to a final state corresponding to data to be stored in the memory cell. Referring to FIGS. 1 and 5, the control logic 120 may write data to the memory cell of the memory cell array 110 by using one of the program methods, based on characteristics of the memory device 100, for example, physical characteristics of the memory cell array 110.

The memory cells that are programmed in any one of the first to seventh program states P1 to P7 may be transited to be in the erase state E through the erase operation. As a high reverse voltage is applied between the substrate and the word lines connected to the memory cells, the threshold voltage Vth of the memory cells may decrease (e.g., move in a leftward direction in FIG. 5) While being erased and verified by an erase verification voltage V0, the threshold voltage Vth may move such that the threshold voltage Vth becomes lower than the erase verification voltage V0. An operation of erasing data of the memory cells may include the erase operation and the erase verification operation of applying an erase voltage (or erase pulses) that is repeatedly applied. In this case, the control logic 120 may erase the data written to the memory cells of the memory cell array based on one of various erase methods.

Figure 6:
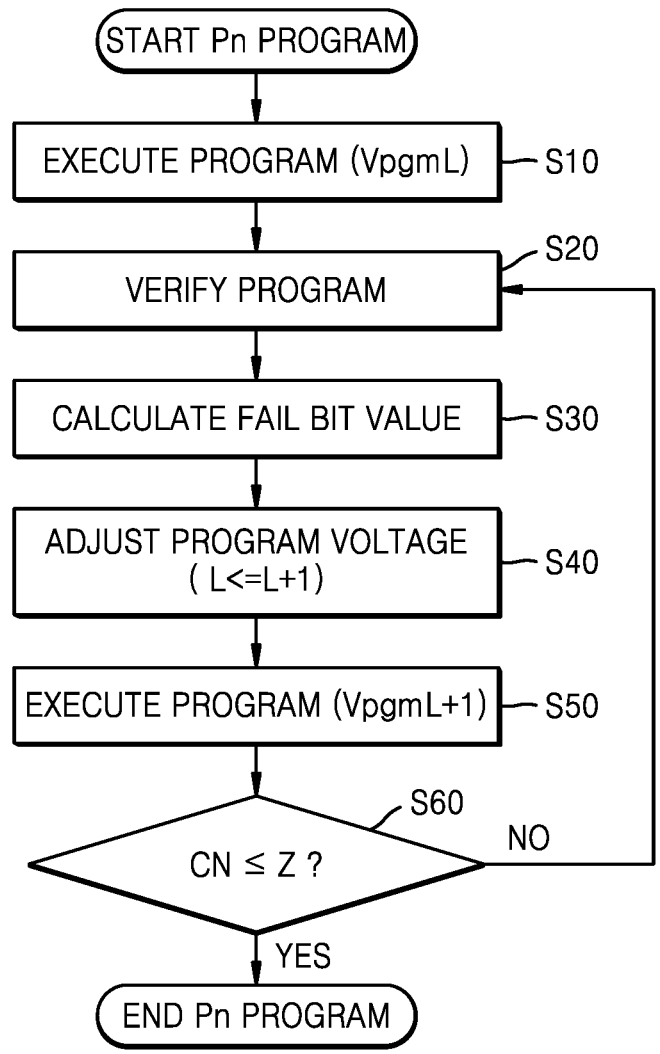
FIG. 6 is a flowchart of a method of operating a memory device according to an embodiment.

FIG. 6 is a flowchart of a method of operating a memory device according to an embodiment. In detail, FIG. 6 shows a method of programming selected memory cells in a certain program state, for example, an $n^{th}$ program state Pn, in the memory cell array 110.

As described above with reference to FIG. 5, the operation of writing data to the memory cells may include the program operation of applying program pulses one after the other, and the verification operation.

In operation S10, a program is executed by applying a program voltage VpgmL to memory cells to be programmed in the $n^{th}$ program state Pn. Data may be written to the memory cell array 110 in a page unit. The memory cells may be programmed by applying the program voltage VpgmL (or a program pulse) to selected word lines corresponding to pages to which the data is written.

In an embodiment, if the $n^{th}$ program state Pn is not the lowermost program state among program states that the memory cells may have, in other words, a state in which a threshold voltage is the lowest, an operation of verifying whether the memory cells are programmed in the $n^{th}$ program state Pn may be performed in advance before the program is executed in operation S10. Thus, during the previously performed operation of programming the memory cells to an $(n-1)^{th}$ program state, memory cells (e.g., fast cells) that are already programmed in the $n^{th}$ program state Pn are identified, and an operation of programming memory cells in an $n^{th}$ program state Pn may be skipped for the identified memory cells.

Then, in operation S20, whether the memory cells are programmed in the $n^{th}$ program state Pn is verified. Based on a verification voltage corresponding to the $n^{th}$ program state Pn, program states of the memory cells may be read. Program states of memory cells having a threshold voltage higher than a verification voltage may be read as a first level, for example, logic low. Program states of memory cells having a threshold voltage lower than the verification voltage may be read as a second level, for example, logic high.

The memory cells that are not determined as being programmed in the $n^{th}$ program state Pn through the verification operation are processed as fail bits. For example, memory cells outputting the logic high may reflect a failed programming attempt in the $n^{th}$ program state Pn and are processed as fail bits. The fail bit value CN, that is, the number of fail bits, may be calculated in operation S30.

The program voltage VpgmL is increased in operation S40, and the program may be executed again on the memory cells that are processed as the fail bits, based on the increased program voltage VpgmL+1 in operation S50. In this case, operation S30 in which the fail bit value CN is calculated may be simultaneously performed with operation S40 in which the program voltage VpgmL is increased and operation S50 in which the program is executed again based on the increased program voltage VpgmL+1.

A determination as to whether the fail bit value CN is less than or equal to a threshold value Z that is set in advance is made in operation S60. When the fail bit value CN is greater than the threshold value Z, operation S20 to operation S50 may be repeatedly performed. When the fail bit value CN is less than or equal to the threshold value Z, the program regarding the $n^{th}$ program state Pn is terminated. In an embodiment, an operation of programming some memory cells in an n+ program state may be performed later. In another embodiment, when the $n^{th}$ program state Pn is the uppermost state among program states that the memory cells may have, it may be determined that data is no longer being written on the memory cells, and a write operation may be stopped. In other words, when the $n^{th}$ program state Pn is in a state in which a threshold voltage is the highest, it may be determined that writing of data on the memory cells is finished, and thus, a write operation may be stopped.

According to the program method, after the program is verified, when the fail bit value CN is less than or equal to the threshold value Z, an additional program operation is further performed to determine whether a program regarding the $n^{th}$ program state Pn may pass. Then, after the program operation is performed once again based on the increased program voltage VpgmL+1 in operation S50, the program regarding the $n^{th}$ program state Pn may be terminated.

A program verification operation needs to be performed after the increased program voltage VpgmL+1 is applied. However, according to an embodiment of the present disclosure, when the fail bit value CN calculated before the program is executed is less than or equal to the threshold value Z, the program verification operation is skipped, thereby reducing a program time of the memory device 100 (of FIG. 1).

Figure 7:
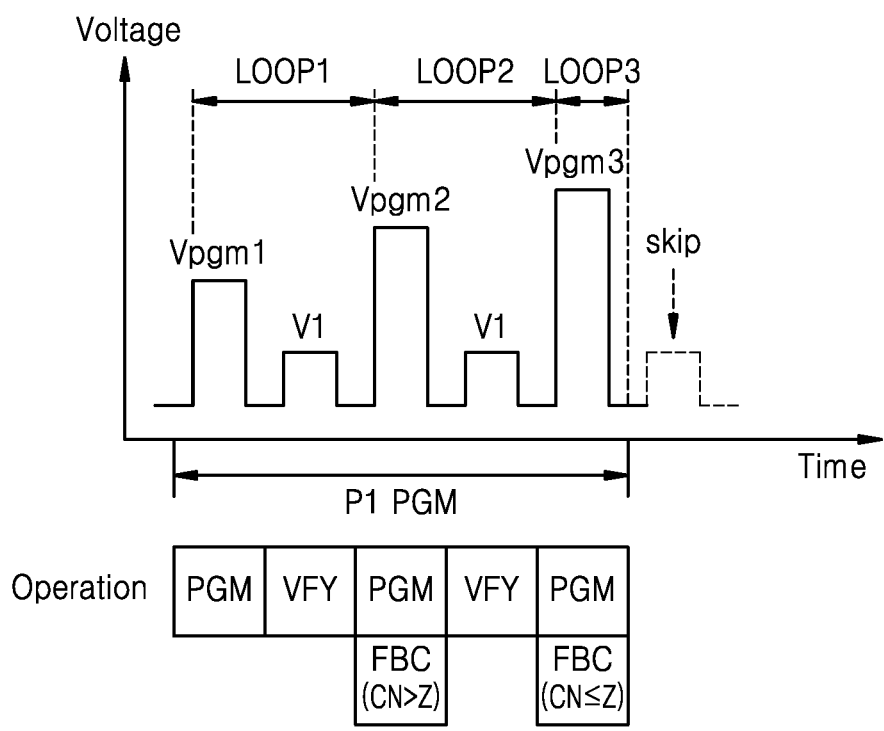
FIG. 7 is a graph for explaining an operation of programming memory cells to a first program state, according to an embodiment.

FIG. 7 is a graph for explaining an operation of programming memory cells to a first program state according to an embodiment and shows the method of FIG. 6 in more detail.

Referring to FIG. 7, a horizontal axis of the graph indicates a time, and a vertical axis thereof indicates memory cells to be programmed, in other words, a voltage applied to word lines of a page. As shown in FIG. 7, as program voltages Vpgm1, Vpgm2, and Vpgm3 (or program voltage pulses) having levels that are sequentially increased are applied to the word lines, a program PGM may be executed. After the program voltages Vpgm1, Vpgm2, and Vpgm3 are applied to the word lines respectively, program states of memory cells are read based on a first voltage V1 applied to the word lines, and thus a program verification operation VFY may be performed. A program operation may include a plurality of program loops (for example, first through third program loops LOOP1, LOOP2, and LOOP3), and each of the plurality of program loops, except for the last program loop, may include an operation of applying a program voltage, that is, execution of the program PGM and the program verification operation VFY.

Figure 8:
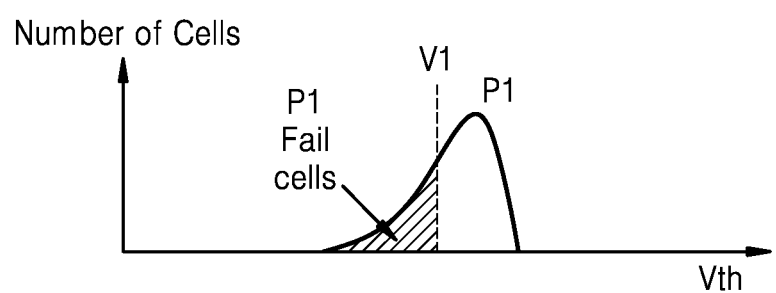
FIG. 8 is a graph showing fail cells in a first program state.

As shown in FIG. 8, among memory cells on which the program PGM is executed, memory cells having a threshold voltage lower than the first voltage V1 may be determined as fail cells (or fail bits) with regard to a first program state P1.

After each program verification operation VFY is performed, the program PGM may be executed again on the fail cells based on an increased program voltage. At the same time, a fail bit counting operation FBC may be performed. As a result of counting fail bits, when the fail bit value CN is less than or equal to the threshold value Z that is set in advance, a verification operation that is to be performed after the program PGM is executed may be skipped based on the increased program voltage. In other words, while the program voltage is applied in the program loop, the fail bit counting operation FBC with respect to a previous program loop may be performed, and when the fail bit value CN is equal to or less than the threshold value Z that is set in advance, the verification operation of the program loop may be skipped. For example, when the third program voltage Vpgm3 is applied to the word line in the third program loop LOOP3, the fail bit counting operation FBC with respect to the second program loop LOOP2 may be performed, and when the fail bit value CN is equal to or less than the threshold value Z that is set in advance, program pass due to the operation of applying the third program voltage Vpgm3 may be determined, and thus, the verification operation of the third program loop LOOP3 may be skipped.

The threshold value Z may be relatively greater than the fail bit value CN that is used to determine that all of the memory cells, on which the program PGM is executed, are programmed in the first program state P1. For example, when the memory cells on which the program PGM is executed are 4 KB, the number of fail bits is approximately less than or equal to 100 after the program is performed on the memory cells. In other words, when the pages on which the program PGM are executed are 4 KB, the number of fail bits is approximately less than or equal to 100 after the program is performed. If a determination is made that programming of the pages in the first program state P1 passes, the threshold value Z may set to be, for example, about 8000. When the fail bit value CN is less than or equal to 8000, the additional program operation is performed once again. Then, it is determined that the number of fail bits may decrease to 100 at most, and a verification operation that is to be performed after the additional program operation may be skipped. The threshold value Z used to determine whether to skip the verification operation may be set to be relatively higher than the number of fail bits used to determine whether the program PGM has passed/failed. The number of fail bits, which are used to determine whether the program PGM has passed/failed, and the threshold value Z are specifically defined here, but the details of how a program PMG passes or fails is not limited thereto. The number of fail bits and the threshold value Z may be determined according to Error Check and Correction (ECC) performance of a memory system, scattering characteristics of program states of the memory cell array 110, or the like.

Figure 9A:
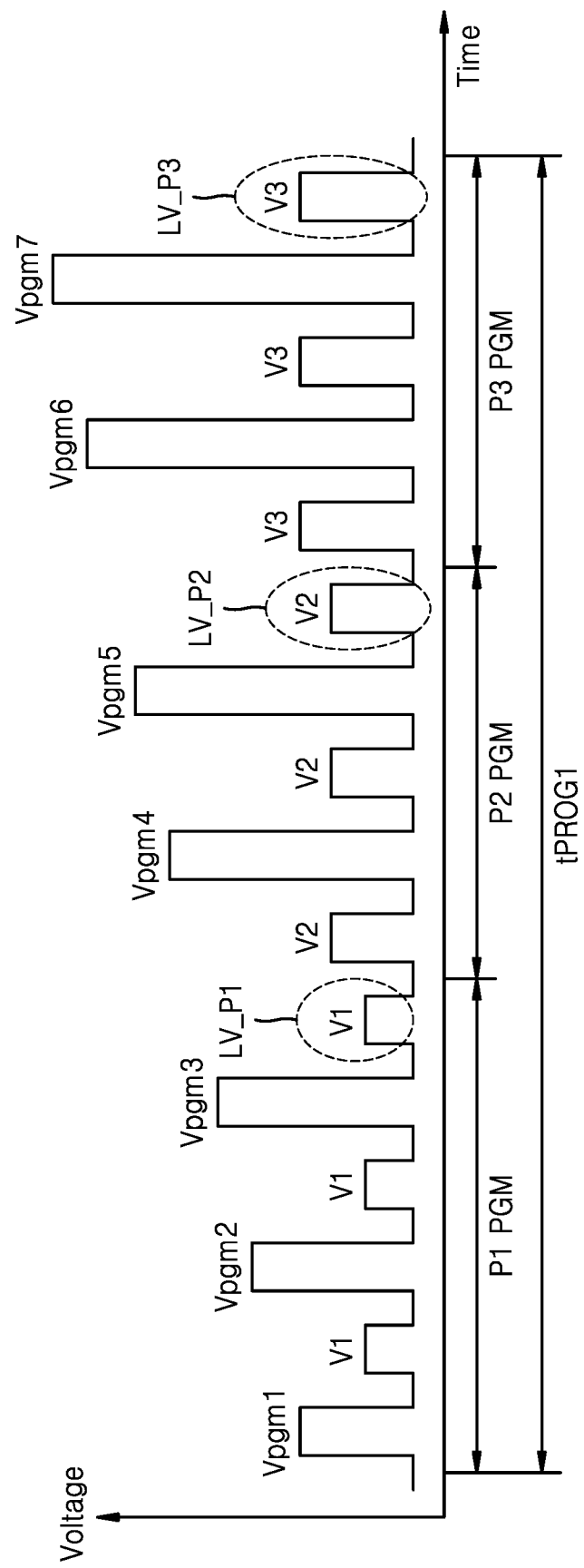
Figure 9B:
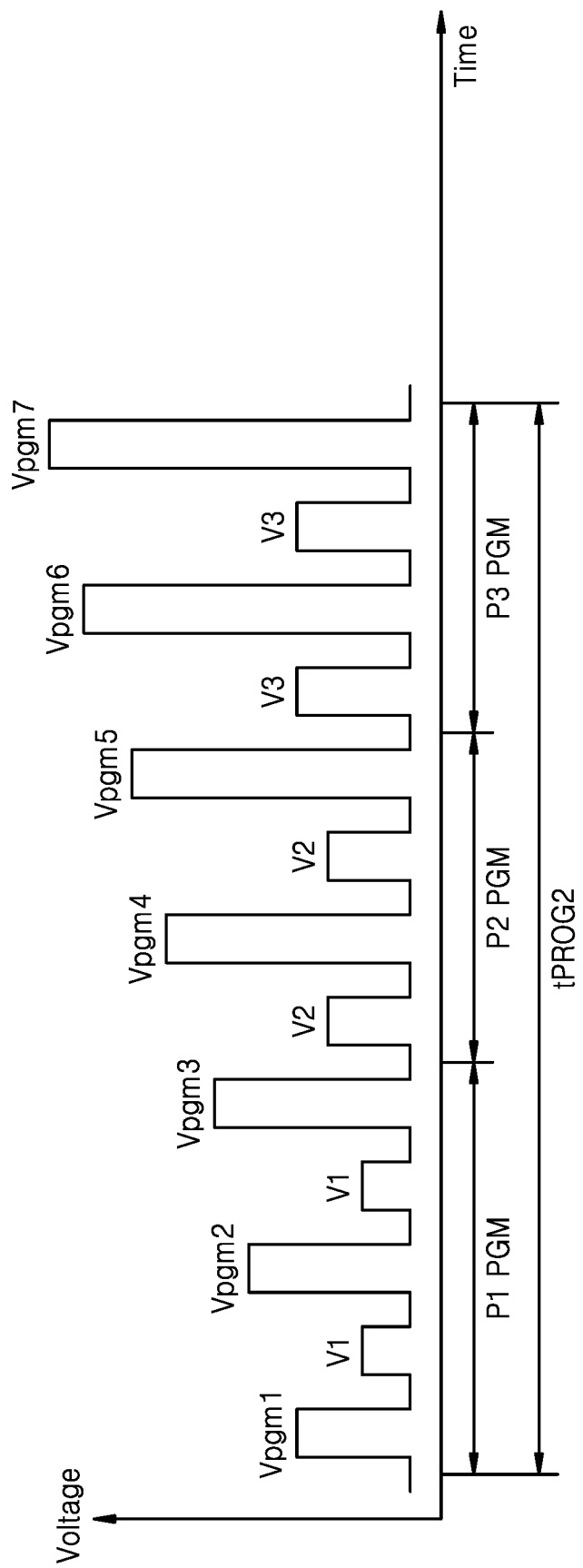

FIGS. 9A and 9B are graphs for explaining program processes and a program time when 2-bit data is written to memory cells. FIG. 9A shows a comparative example, and FIG. 9B is a graph for explaining a program method and a program time according to an embodiment. When the memory cells are programmed in a first program state P1, it is assumed that a program is executed three times. When the memory cells are programmed in a second program state P2 and a third program state P3, it is assumed that the program is executed twice in each. When the program is repeatedly executed, levels of first to seventh program voltages Vpgm1 to Vpgm7 may increase. In this case, in an embodiment, increases in ranges of the levels of the first to seventh program voltages Vpgm1 to Vpgm7 are the same as each other. For example, the program may be executed by using an incremental step pulse program (ISPP) method. In another embodiment, the increases in ranges of the levels of the first to seventh program voltages Vpgm1 to Vpgm7 may differ from each other.

Referring to FIG. 9A, after the program is executed each time, a verification operation regarding each program state may be performed. Although not shown, after the verification operation is performed, fail bits may be counted while or before the program is executed. When the number of fail bits is less than or equal to a program pass reference value that is set in advance, the program regarding each program state is terminated, and a program regarding a next program state may start. For example, in a P1 program section P1 PGM where the memory cells are programmed in the first program state P1, the number of fail bits may be less than or equal to the program pass reference value after a last verification operation LV_P1 is performed. Accordingly, an operation of programming the memory cells in the second program state P2 may be performed. In an embodiment, as shown in FIG. 9A, in order to block the memory cells that are programmed to the second program state P2 in the P1 program section P1 PGM, a verification operation regarding the second program state P2 is performed, and then the program may be executed on fail cells.

In a P2 program section P2 PGM, the number of fail bits may be less than or equal to the program pass reference value after a last verification operation LV_P2 is performed. Accordingly, an operation of programming the memory cells in the third program state P3 may be performed.

In a P3 program section P3 PGM, the number of fail bits may again be less than or equal to the program pass reference value after a last verification operation LV_P3 is performed. Accordingly, an operation of writing data to the memory cells may be completed.

According to the program method shown in FIG. 9B, after each verification operation is performed, fail bits may be counted while the program is executed. In the P1 program section P1 PGM, after a second verification operation is performed, the number of fail bits may be less than or equal to a first threshold value Z1 that is set in advance. Accordingly, the program is executed as the third program voltage Vpgm3 is applied to the memory cells. Then, the operation of programming the memory cells in the second program state P2 may be performed without performing an additional verification operation regarding the first program state P1.

Also, in the P2 program section P2 PGM, after the second verification operation is performed, the number of fail bits may be less than or equal to a second threshold value Z2 that is set in advance. Accordingly, the program is executed as the fifth program voltage Vpgm5 is applied to the memory cells. Then, the operation of programming the memory cells in the third program state P3 may be performed without performing an additional verification operation regarding the second program state P2.

In the P3 program section P3 PGM, after the second verification operation is performed, the number of fail bits may be less than or equal to a third threshold value Z3 that is set in advance. Accordingly, the program is executed as the seventh program voltage Vpgm7 is applied to the memory cells. Then, the operation of writing the data to the memory cells may be completed without performing an additional verification operation regarding the third program state P3. In an embodiment, the first threshold value Z1, the second threshold value Z2, and the third threshold value Z3 may be the same. In another embodiment, the first threshold value Z1, the second threshold value Z2, and the third threshold value Z3 may differ.

As shown in FIGS. 9A and 9B, according to the program method, as the last verification operations LV_P1, LV_P2, and LV_P3 are skipped in each of the program states P1 to P3, a total program time tPROG2 taken to write data may decrease in comparison with a total program time tPROG1 of the comparative example.

Figure 10:
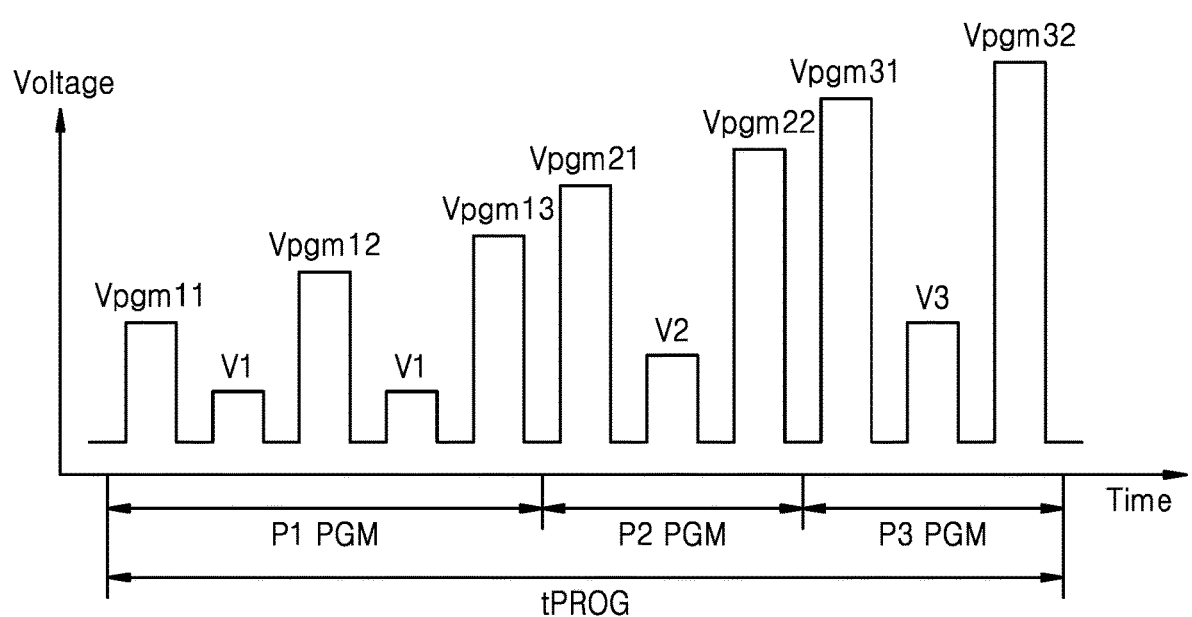
FIG. 10 shows another example of a program method according to an embodiment.

FIG. 10 shows another example of a program method according to an embodiment.

Upon comparing the program method of FIG. 10 with the program method of FIG. 9B, a verification operation may be skipped before a program voltage is applied in each of the program states P1 to P3 in FIG. 10. For example, when a scattering difference between the program states P1 to P3 is great, memory cells that are programmed in the second program state P2 in the P1 program section P1 PGM and memory cells that are programmed in the third program state P3 in the P2 program section P2 PGM may not exist. Therefore, a total program time tPROG may be reduced by skipping the verification operation before the program voltage is applied.

When a program is repeatedly performed, levels of program voltages Vpgm11 to Vpgm32 may increase. In this case, in an embodiment, increases in ranges of the levels of the program voltages Vpgm11 to Vpgm32 may differ from each other. For example, the increases in ranges of the levels of the program voltages Vpgm11 to Vpgm13 that are applied to word lines in the P1 program section P1 PGM may differ. In an embodiment, increases in ranges of a level of a program voltage (e.g., the program voltage Vpgm13) that is applied to the word line last in each program section and levels of program voltages (e.g., Vpgm21, Vpgm22, and Vpgm31) that are applied to the word lines first in a next program section may be greater than increases in ranges of levels of program voltages applied to the word lines in the same program section. The program sections include, for example, the program voltages Vpgm11, Vpgm12 and Vpgm13 in the P1 program section P1 PGM, the program voltages Vpgm21 and Vpgm22 in the P2 program section P2 PGM, and the program voltages Vpgm31 and Vpgm32 in the P3 program section P3 PGM.

According to the method of operating a memory device that is described with reference to FIGS. 6 and 10, values of fail bits are output when memory cells have failed to be programmed. When a verification operation determines that values of the fail bits are less than or equal to a threshold value that is set in advance when data is written to the memory cells, an additional program operation is performed on the memory cells. A verification operation that is to be performed after a program operation is skipped, thereby reducing a total program time, that is, a data write time.

As described above, since the threshold value may be set to have a high level, for example, at least 1000, counting performance (e.g., the number of fail bits that are counted at most) of the fail bit counter 160 needs to be improved. According to a method of counting fail bits, a connection relationship between the page buffer unit 150 and the fail bit counter 160, and methods of operating the page buffer unit 150 and the fail bit counter 160, the counting performance of the fail bit counter 160 may be improved. Hereinafter, the method of counting the fail bits, the page buffer unit 150, and the fail bit counter 160 will be described.

Figure 11:
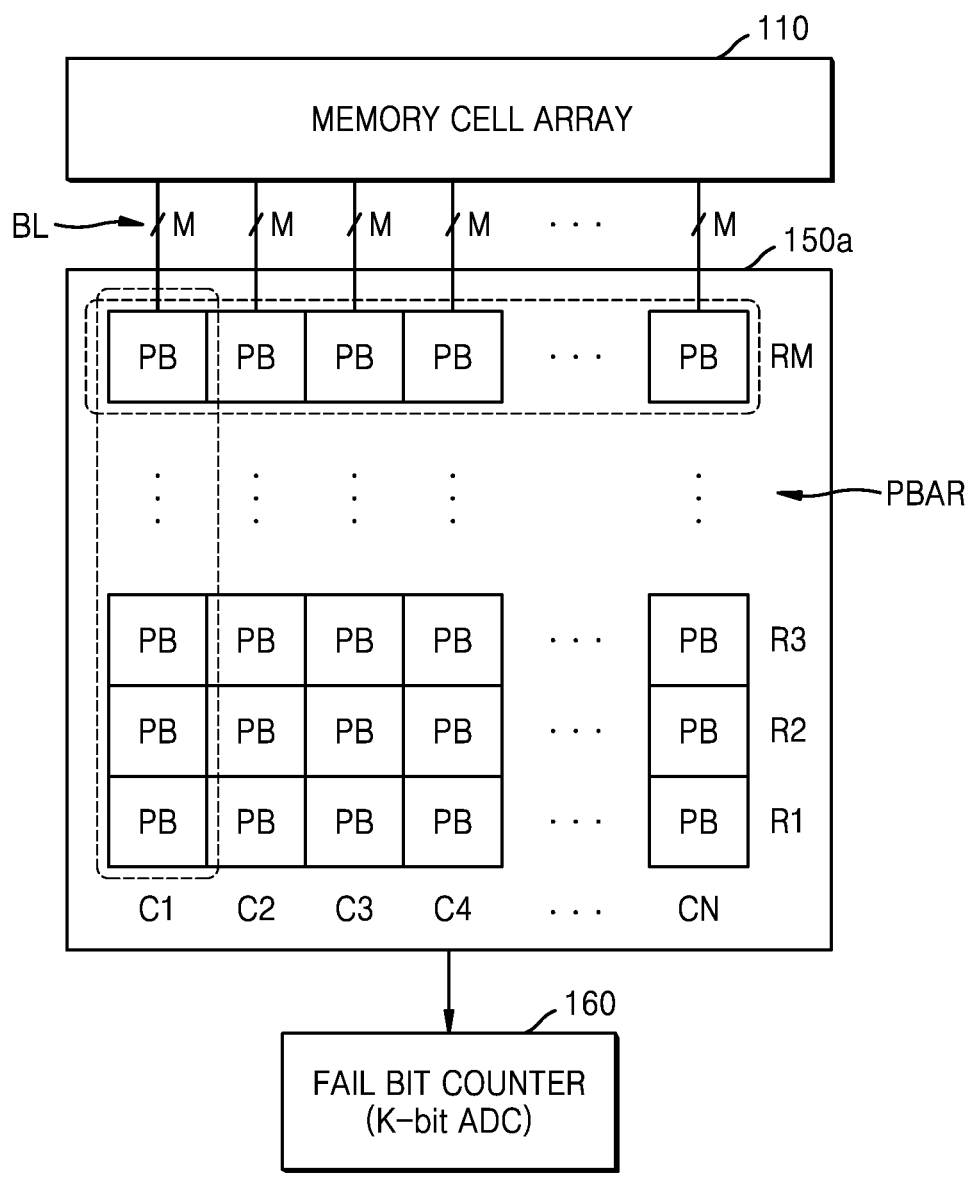
FIG. 11 is a diagram of an example of a page buffer unit according to an embodiment.
Figure 12:
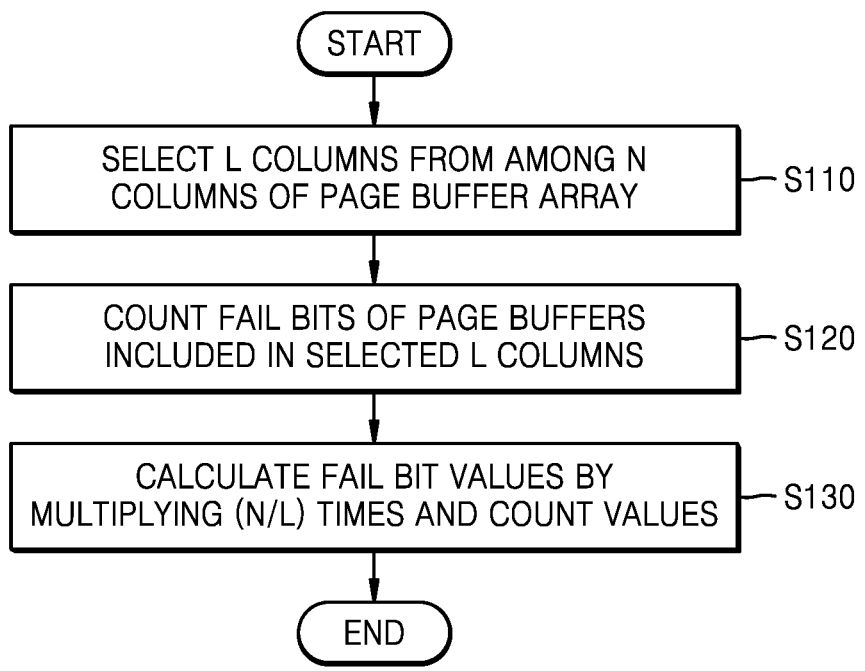
FIG. 12 is a flowchart of a method of counting fail bits stored in a page buffer unit, according to an embodiment.

FIG. 11 is a diagram of an example of a page buffer unit 150a according to an embodiment. FIG. 12 is a flowchart of a method of counting fail bits stored in the page buffer unit 150a, according to an embodiment. For convenience, FIG. 11 shows the page buffer unit 150a together with the memory cell array 110 and the fail bit counter 160.

Referring to FIG. 11, the page buffer unit 150a may include a page buffer array PBAR in which page buffers PB are arranged in a matrix form.

The page buffer array PBAR may include N columns C1 to CN and M rows R1 to RM. M page buffers PB included in each column may be connected to M bit lines BL that are adjacent to one another in the memory cell array 110. In other words, the M bit lines BL that are adjacent to one another in the memory cell array 110 may be respectively connected to the page buffers PB that are arranged in a column direction. For example, as shown in FIG. 11, each of the M bit lines BL on the left side may be connected to each of the M page buffers PB that are arranged in a first column C1. As a memory cell array is highly integrated, pitches between bit lines are greatly smaller than pitches between page buffers, and thus the M bit lines BL that are adjacent to one another are connected to the page buffers PB arranged in the column direction instead of a row direction. Therefore, the page buffers PB may form the page buffer array PBAR as shown in FIG. 11.

Each page buffer PB may store data to be written to memory cells connected to their corresponding bit lines BL or may store data read from the memory cells. Also, the page buffer PB may store a program verification result when the data is written to the memory cells or an erase verification result when the data is erased from the memory cells. To this end, each page buffer PB may include multiple of latches.

As described above, the operation of writing the data to the memory cells may include the program operation of applying program pulses one after the other, and the verification operation. When the verification operation is performed after the program pulses are applied to the memory cells, if the memory cells are determined as program fail cells because threshold voltages of the memory cells do not reach a target level, the page buffer PB stores fail bits indicating that the memory cells are not normally programmed. Then, the memory cells are programmed in program states corresponding to the data by repeatedly applying the increased program voltage to the program fail cells and verifying the program fail cells.

The fail bit counter 160 may count the fail bits sequentially stored in the page buffer array PBAR in a row unit. For example, the fail bit counter 160 may count the number of fail bits stored in page buffers PB of a first row R1 and then the number of fail bits stored in page buffers PB of a second row R2. By repeatedly counting the fail bits in the row unit, the fail bit counter 160 may count the number of fail bits stored in page buffers PB of the last row RM. In an embodiment, the fail bit counter 160 may count fail bits based on signals, for example, current signals, which are output from each row of the page buffer array PBAR. In each operation of counting the fail bits, the fail bit counter 160 may count K fail bits at most. For example, when K is 16, the fail bit counter 160 may count 16 fail bits at most in each row and may output 16*M fail bit values at most.

However, according to the method of counting the fail bits as in FIG. 12, the fail bit counter 160 may calculate a larger number of fail bit values.

Referring to FIG. 12, the method of counting the fail bits according to an embodiment will be described. The method of counting the fail bits may be performed by the fail bit counter 160 and the page buffer unit 150a under the control of the control logic 120 (of FIG. 1).

Referring to FIG. 12, the control logic 120 may select L columns (where, L is an integer greater than 1 but less than N) from among N columns of the page buffer array PBAR in operation S110. The selection of columns may be referred to as column sampling. In an embodiment, one of every N/L columns of the page buffer array PBAR may be selected. In another embodiment, two consecutive columns may be selected from among every N/(L/2) columns of the page buffer array PBAR. In an embodiment, arrangement spaces between the selected columns may be the same. However, the control logic 120 is not limited thereto, and a method of selecting columns may vary.

The fail bit counter 160 counts fail bits of page buffers included in the selected L columns in operation S210. In other words, column sampling is performed, and fail bits output from the page buffers included in the columns for which the column sampling is performed may be counted. Then, the fail bit counter 160 may calculate fail bit values by multiplying (N/L) times the counted number of fail bits in operation S130. The N/L may be a column sampling ratio. As the number of columns selected in operation S110 is small, the column sampling ratio may increase.

For example, the fail bit counter 160 counts fail bits in each row, and when K is 16, the fail bit counter 160 may count 16 fail bits at most in each row and may count 16*M fail bits. The fail bit counter 160 may calculate fail bit values by multiplying the count number of fail bits and the column sampling ratio and thus may calculate 16*M*N/L fail bit values. For example, when the column sampling ratio is 8, the fail bit counter 160 may calculate 8 times as many fail bit values compared to when column sampling is not used.

According to the method of counting the fail bits, as the column sampling ratio increases, accuracy of the fail bit values output from the fail bit counter 160 may decrease. However, a maximum value of the fail bit value output from the fail bit counter 160 may be increased. In other words, the counting performance of the fail bit counter 160 may be improved.

Figure 13A:
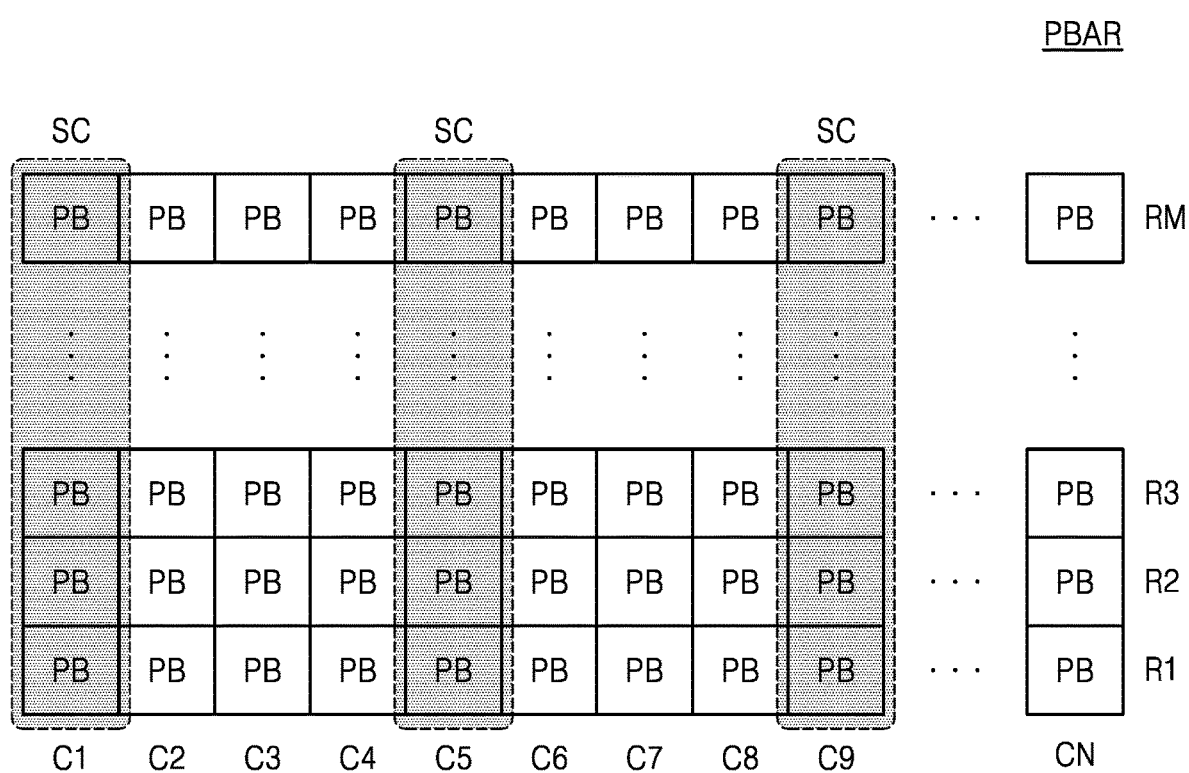
FIGS. 13A and 13B are diagrams showing columns selected from among columns included in a page buffer array.
Figure 13B:
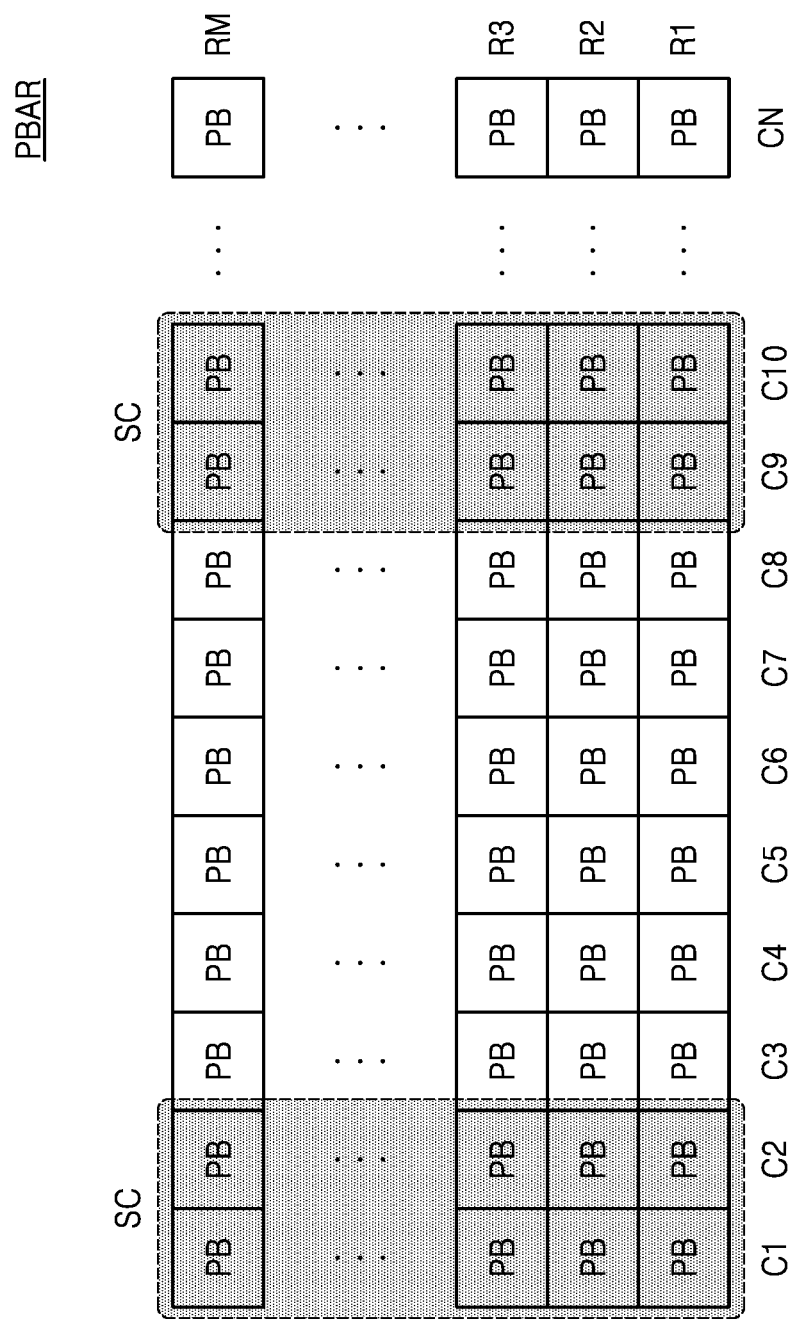

FIGS. 13A and 13B are diagrams showing columns selected from among columns included in the page buffer array PBAR.

Referring to FIG. 13A, in the page buffer array PBAR, one (e.g., C1 or C5) of four columns (e.g., C1 to C4 or C5 to C8) may be selected. Arrangement spaces between the selected columns SC, that is, the columns C1, C5 and C9, may be the same.

Referring to FIG. 13B, two consecutive columns (e.g., C1 and C2 or C9 and C10) may be selected from among eight columns (e.g., C1 to C8 or C9 to C16).

FIGS. 13A and 13B show examples of the selected columns SC, but the mechanisms for selecting columns is not limited thereto. A method of selecting columns may vary.

Figure 14:
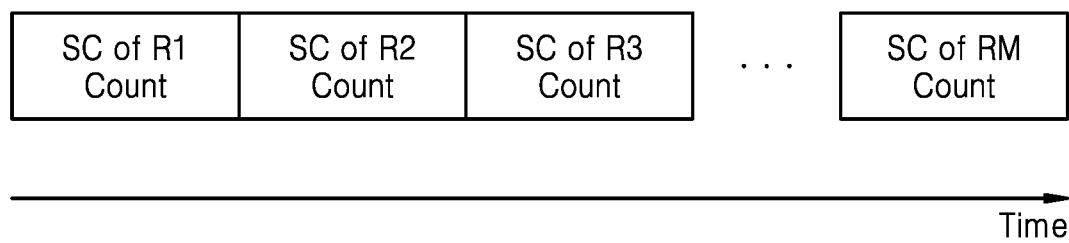
FIG. 14 is a diagram temporally showing a counting operation of a fail bit counter, according to an embodiment.

FIG. 14 is a diagram temporally showing a counting operation of the fail bit counter 160, according to an embodiment.

Referring to FIG. 14, the fail bit counter 160 may count fail bits of selected columns SC of a first row R1 and may count fail bits of selected columns SC of a second row R2. Fail bits may be counted sequentially from the selected columns SC of the first row R1 to those of the $M^{th}$ row RM.

Although not shown in FIG. 14, the fail bit counter 160 may count the fail bits of the selected columns SC of the $M^{th}$ row RM. The fail bit counter 160 then may calculate the fail bit values for a page by adding the number of fail bits that are counted in each row and then performing a logic operation of multiplying a column sampling ratio and the total number of fail bits, in other words, a ratio of selected columns to the total number of columns.

Figure 15:
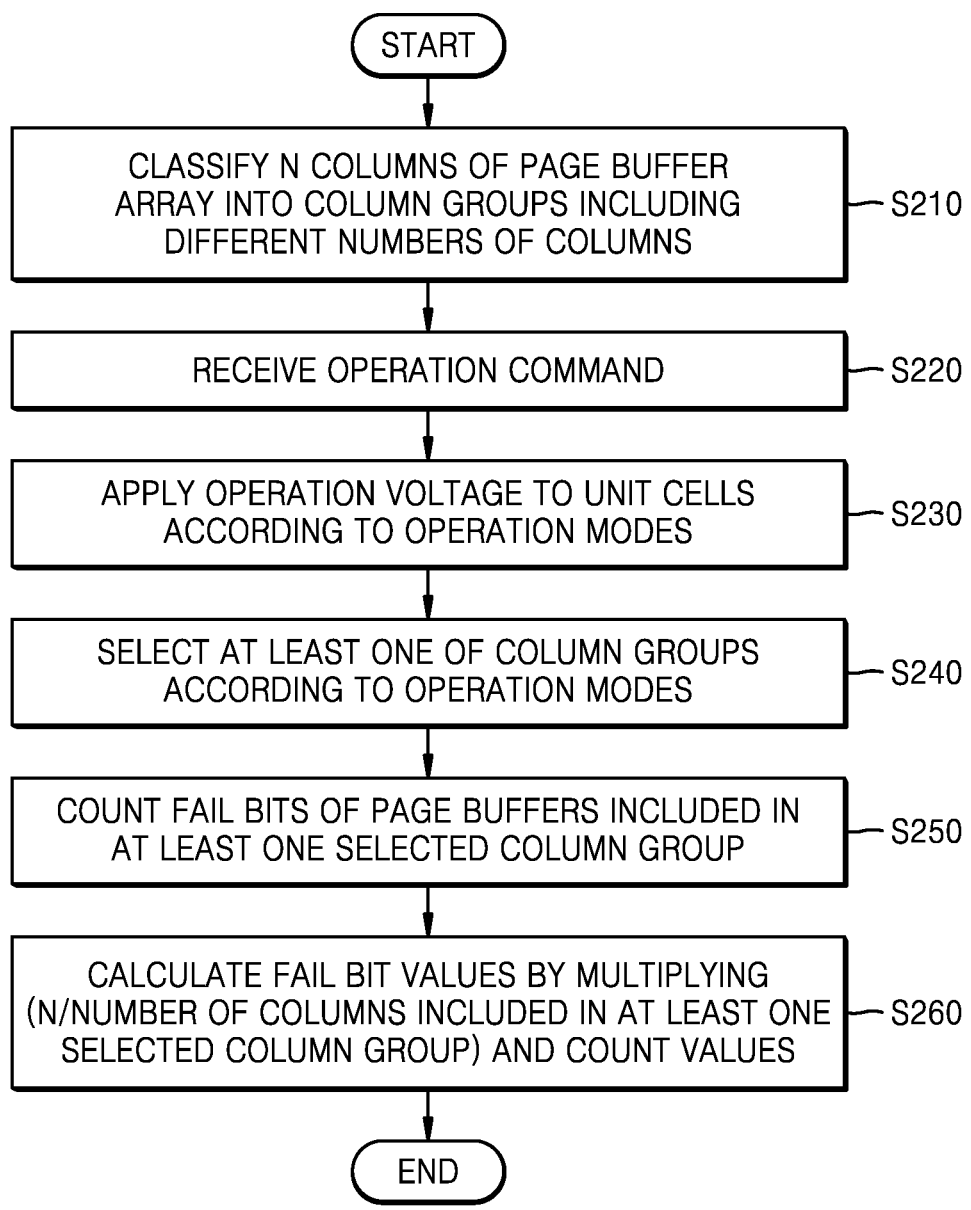
FIG. 15 is a flowchart of another example of a method of counting fail bits according to an embodiment.

FIG. 15 is a flowchart of another example of a method of counting fail bits according to an embodiment.

Referring to FIG. 15, N columns of a page buffer array PBAR may be classified into column groups that include different numbers of columns in operation S210. The classification may be performed by the control logic 120 or during a manufacturing process according to a physical connection relationship between the page buffer array PBAR and the fail bit counter 160.

The memory device 100 receives an operation command in operation S220 and, in operation S230, applies an operation voltage to unit cells on which an operation corresponding to the operation command is performed, according to an operation mode, for example, a single level cells write mode, a multi-level cell write mode, or an erase mode. For example, in a write mode, the memory device 100 may apply a program voltage to memory cells included in the page of the memory cell array 110. Also, in an erase mode, the memory device 100 may apply an erase voltage to memory cells included in a block of the memory cell array 110.

Then, according to an operation mode, at least one column group may be selected from among column groups in operation S240. Fail bits of page buffers included in the at least one column group may be counted in operation S250.

Fail bit values are calculated by multiplying count values and a column sampling ratio (N/the number of columns included in at least one column group selected from among column groups) in operation S260.

The method of counting the fail bits in FIG. 15 will be described in more detail with reference to the page buffer array PBAR of FIG. 16.

Figure 16:
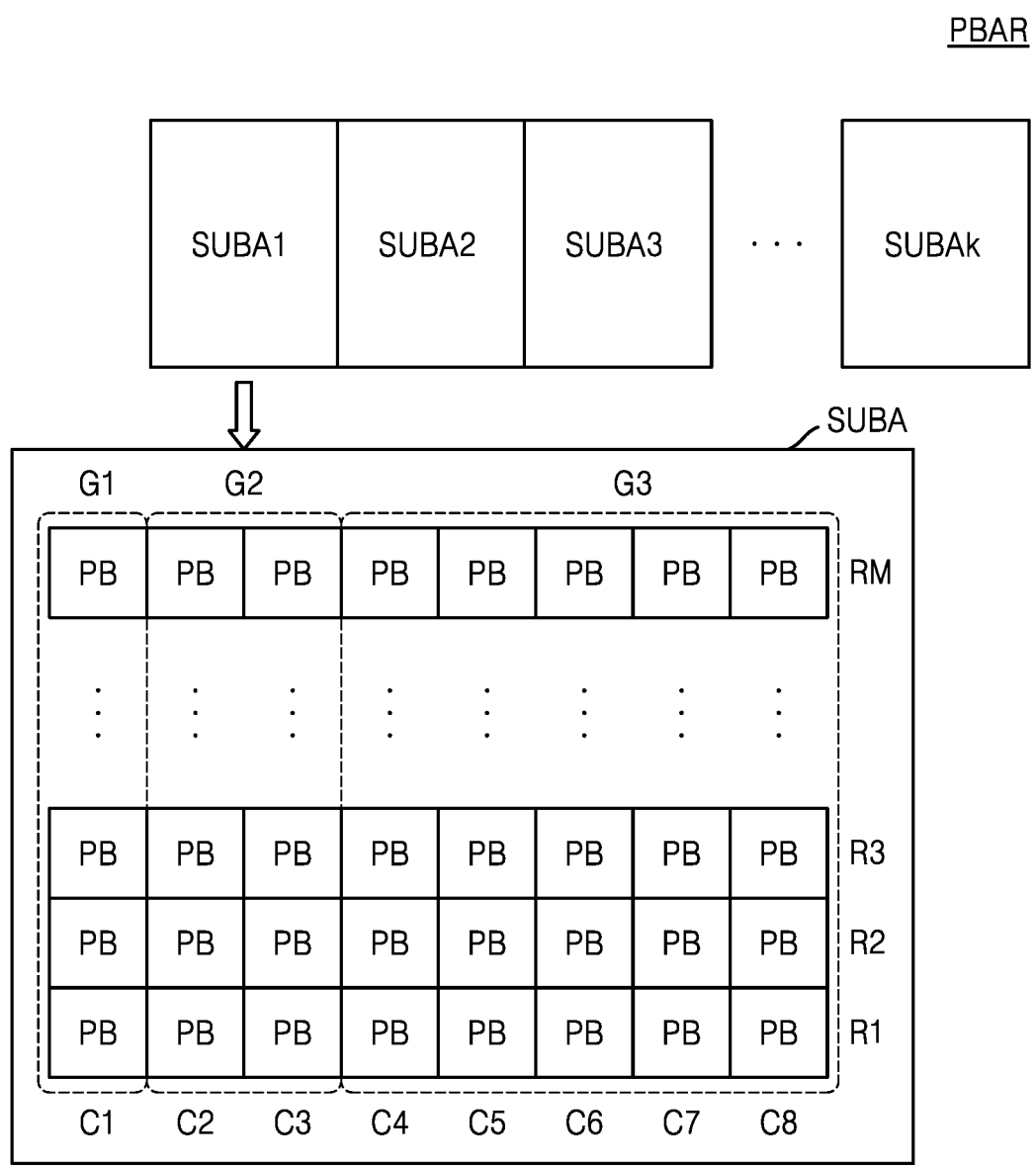
FIG. 16 is a diagram of an example of a page buffer array according to an embodiment.

FIG. 16 is a diagram of an example of a page buffer array PBAR according to an embodiment.

Referring to FIG. 16, the page buffer array PBAR may include sub arrays SUBA1 to SUBAk, and each of the sub arrays SUBA1 to SUBAk may include first to third column groups G1 to G3. As shown in FIG. 16, a case where the sub array SUBA includes eight columns C1 to C8 and three column groups, that is, the first to third column groups G1 to G3, will be described.

In the sub array SUBA, the first column group G1 may include one column, the second column group G2 may include two columns, and the third column group G3 may include five columns. The number of columns included in each of the first and second column groups G1 and G2 and a third column group G3 may differ.

The control logic 120 may select at least one of the first to third column groups G1 to G3 according to an operation mode according to a received operation command In this case, the operation mode may be a write operation mode or an erase mode regarding a single level cells, a multi-level cell, etc. In an operation mode in which scattering characteristics of a program state are important, accuracy of the number of calculated fail bits may be important. Thus, at least one of the first to third column groups G1 to G3 may be selected to select a large number of columns. For example, in a triple level cells write mode, all of the first to third column groups G1 to G3 are selected such that a sampling ratio may decrease, and accuracy of the fail bit value may increase.

On the contrary, in an operation mode in which program speed is more important than scattering characteristics of the program state, at least one column group may be selected from among the first to third column groups G1 to G3 to select a small number of columns such that the maximum number of calculated fail bits may be great. For example, in a single level cells write mode, the first column group G1 is selected from among the first to third column groups G1 to G3 in order to increase the column sampling ratio.

The fail bit counter 160 may count the fail bits of the page buffers included in the at least one column group and may calculate fail bit values by multiplying fail bit count values and the column sampling ratio. For example, in the triple level cells write mode, the fail bit counter 160 may multiply the fail bit count values and 8/8 that is the column sampling ratio, and in the single level cells write mode, the fail bit counter 160 may multiply the fail bit count values and 8/1 that is the column sampling ratio.

According to the method of counting the fail bits which is described with reference to FIG. 15, the column sampling ratio is adjusted according to operation modes, and thus specifications of scattering characteristics and program speed characteristics according to the operation modes may be satisfied.

Figure 17:
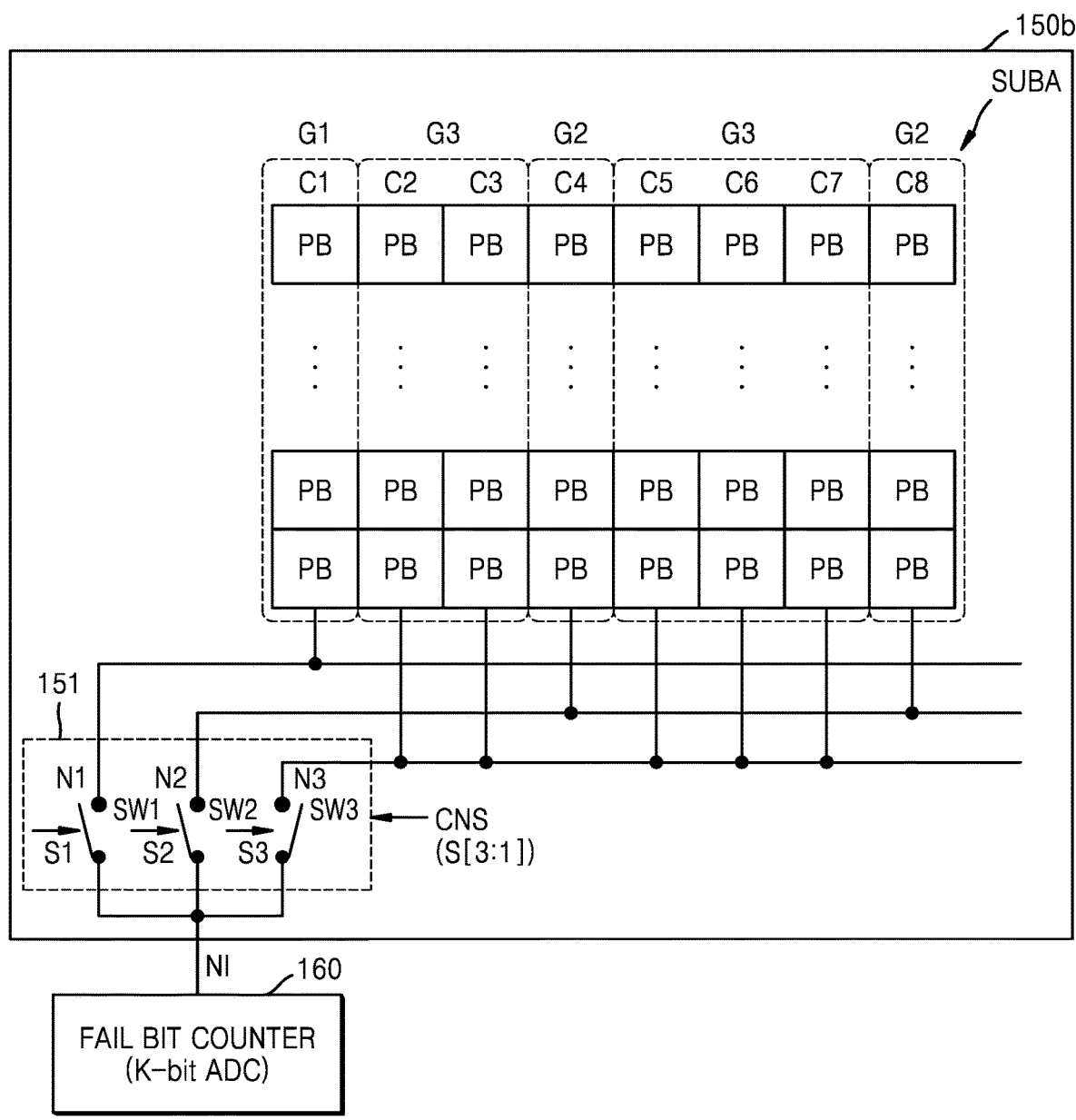
FIG. 17 is a diagram of an example of another page buffer according to an embodiment.

FIG. 17 is a diagram of an example of another page buffer according to an embodiment.

Referring to FIG. 17, a page buffer unit 150*b* may include a sub array SUBA and a connection circuit 151. For convenience, only one sub array SUBA is shown, but the page buffer unit 150*b* may include sub arrays SUBA having the same structure and the same connection relationship as the sub array SUBA shown in FIG. 17, and the sub arrays SUBA may form a page buffer array.

The sub array SUBA may include multiple column groups, that is, first to third column groups G1 to G3, which include different numbers of columns. A first column C1 of the first column group G1 may be connected to a first detection node N1. Columns C4 and C8 of the second column group G2 may be connected to a second detection node N2. Columns C2, C3, C5, C6, C7 of the third column group G3 may be connected to a third detection node N3. As each of the first to third detection nodes N1 to N3 is connected to an input node NI of the fail bit counter 160 via the connection circuit 151, columns connected to each of the first to third detection nodes N1 to N3 may be connected to the fail bit counter 160.

The connection circuit 151 may include first to third switches SW1 to SW3 connecting the first to third detection nodes N1 to N3 to the input node NI of the fail bit counter 160. In response to connection control signals CNS that are input, the first to third switches SW1 to SW3 may be turned on or off. The connection control signals CNS may be 3-bit signals S[3:1]. The first switch SW1 is turned on in response to a first signal S1 of the connection control signal CNS, and thus the first detection node N1 may be connected to the input node NI of the fail bit counter 160. The second switch SW2 is turned on in response to a second signal S2 of the connection control signal CNS, and the second detection node N2 may be connected to the input node NI of the fail bit counter 160. The third switch SW3 is turned on in response to a third signal S3 of the connection control signal CNS, and the third detection node N3 may be connected to the input node NI of the fail bit counter 160.

The connection control signal CNS may be received from the control logic 120 (of FIG. 1). The control logic 120 may generate a connection control signal CNS for selecting at least one of the first to third column groups G1 to G3 in response to an operation command received from the outside, for example, a memory controller.

Hereinafter, with reference to FIGS. 18 to 19C, a method of selecting at least one of columns groups according to an operation mode and counting fail bits of the at least one selected column group will be described. The method is performed in the page buffer unit 150*b* of FIG. 17.

Figure 18:
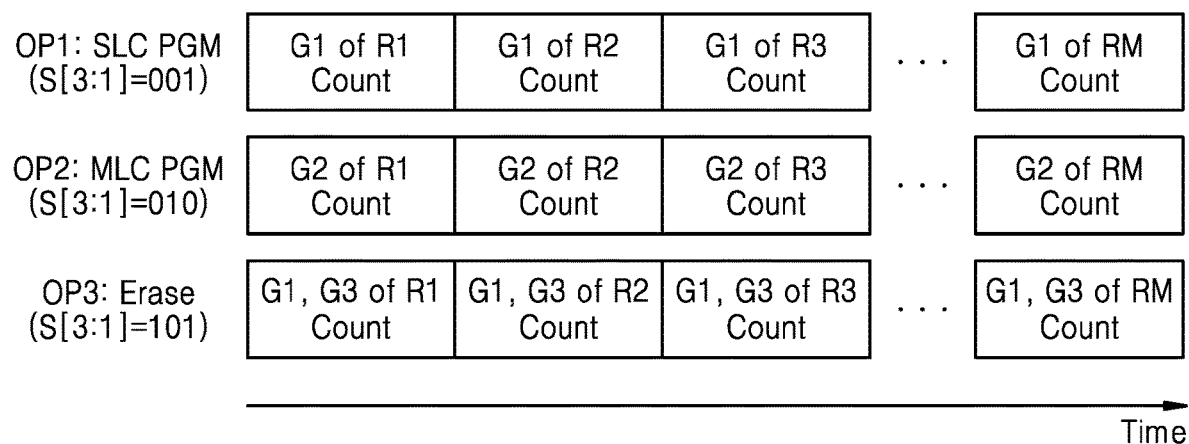
FIG. 18 is a diagram temporally showing a method of counting fail bits according to operation modes.
Figure 19A:
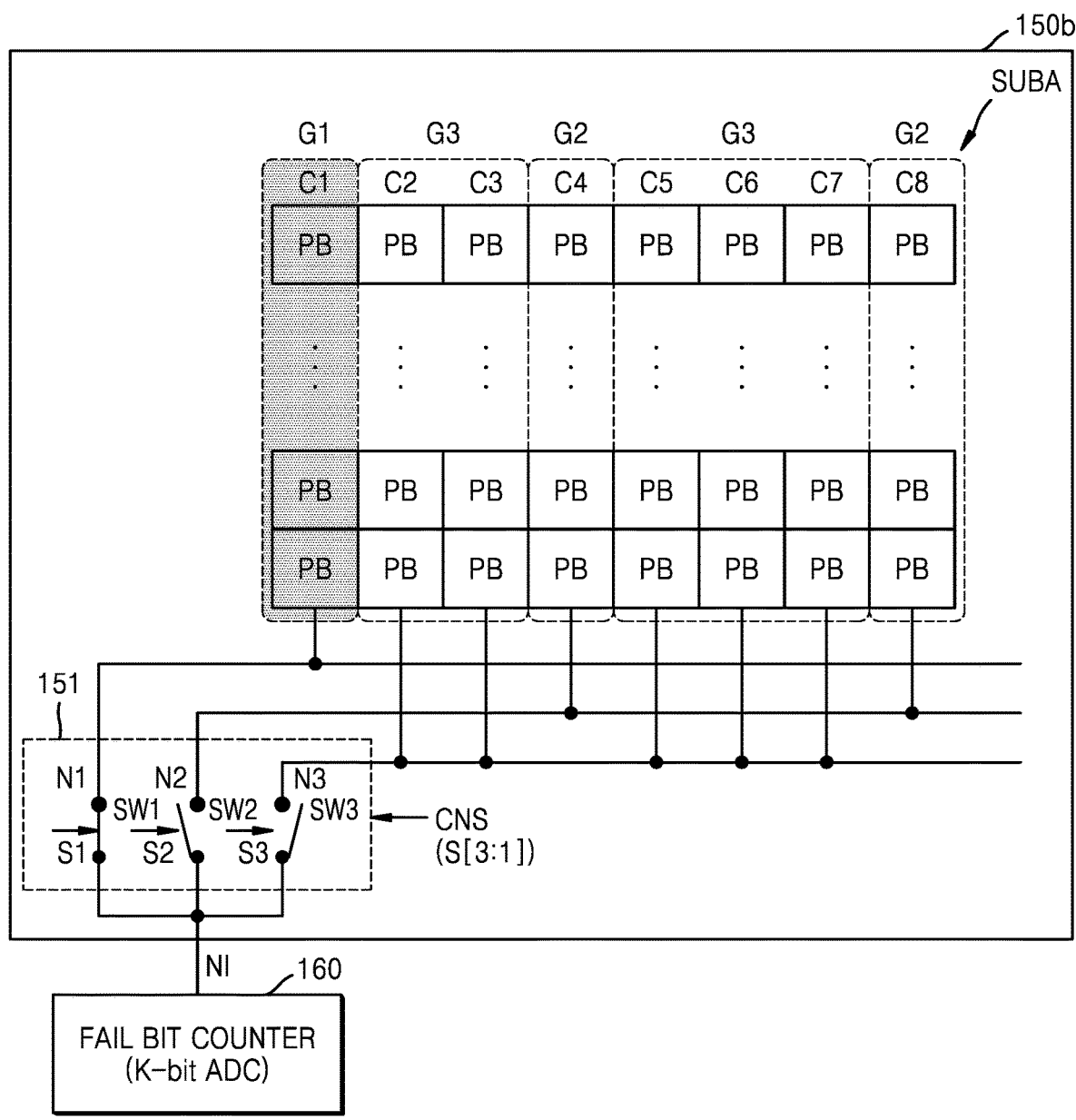
FIGS. 19A to 19C are diagrams showing operations of a connection circuit and column groups selected according to each operation mode of FIG. 18.
Figure 19B:
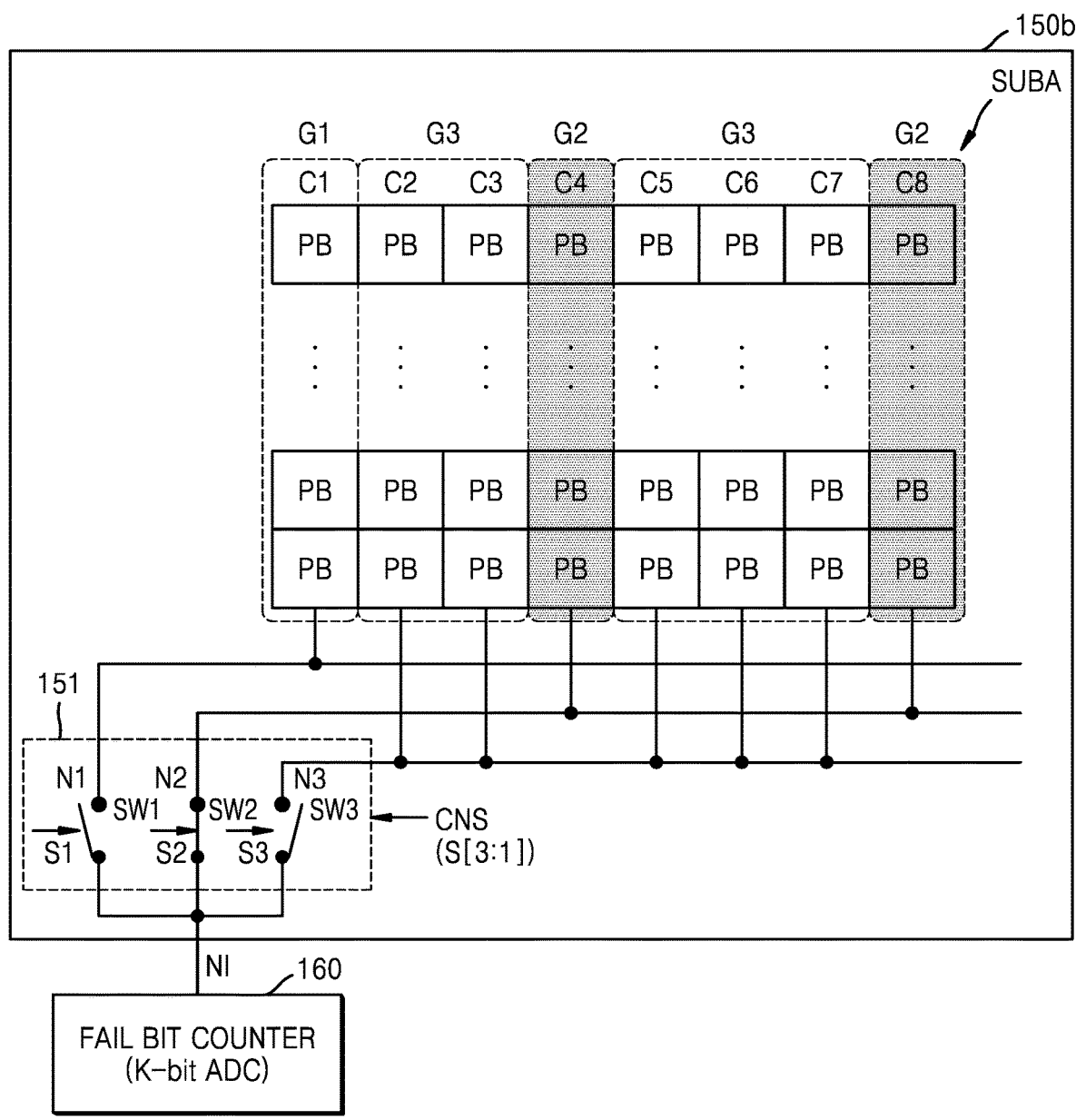
Figure 19C:
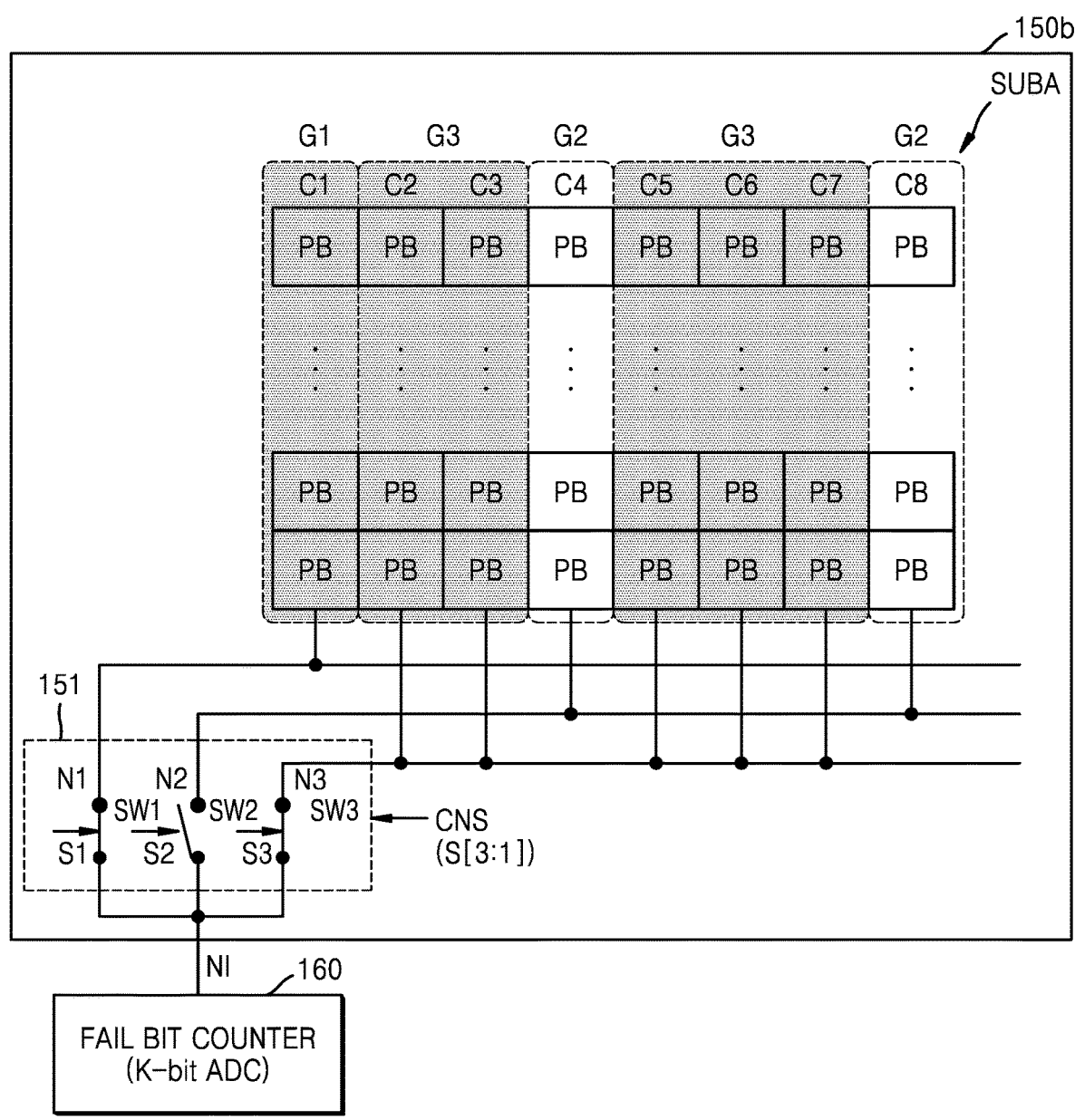

FIG. 18 is a diagram temporally showing a method of counting fail bits according to operation modes, and FIGS. 19A to 19C are diagrams showing operations of connected circuits and column groups selected according to each operation mode of FIG. 18.

Referring to FIG. 18, a first operation mode OP1 may be a single level cells write mode. In the case of the single level cells write mode, a spectrum of a program scattering characteristic may be large. The control logic 120 (of FIG. 1) may generate a connection control signal CNS for selecting a first column group G1 from among first to third column groups G1 to G3 of the page buffer unit 150*b*. First to third signals S[3:1] of the connection control signal CNS may be '001'. Accordingly, as shown in FIG. 19A, a first switch SW1 of a connection circuit 151 is turned on, and a column C1 included in the first column group G1 may be selected from each of sub arrays SUBA. The fail bit counter 160 may count fail bits of the first column group G1 sequentially from a first row R1 to an $M^{th}$ row RM.

A second operation mode OP2 may be a multi-level cell write mode. The control logic 120 may generate a connection control signal CNS for selecting a second column group G2 from among the first to third column groups G1 to G3. First to third signals S[3:1] of the connection control signal CNS may be '010'. Accordingly, as shown in FIG. 19B, a second switch SW2 of the connection circuit 151 is turned on, and two columns C4 and C8 included in the second column group G2 may be selected from each sub array SUBA. The fail bit counter 160 may count fail bits of the second column group G2, which are included in each row sequentially from the first row R1 to the $M^{th}$ row RM.

A third operation mode OP3 may be an erase mode. The control logic 120 may generate a connection control signal CNS for selecting the first column group G1 and a third column group G3 from among the first to third column groups G1 to G3. First to third signals S[3:1] of the connection control signal CNS may be '101'. Accordingly, as shown in FIG. 19B, the first switch SW1 and a third switch SW3 of the connection circuit 151 are turned on, and six columns C1, C2, C3, C5, C6, and C7 included in the first and third column groups G1 and G3 may be selected from the sub array SUBA. The fail bit counter 160 may count fail bits of the first and third column groups G1 and G3, which are included in each row sequentially from the first row R1 to the $M^{th}$ row RM.

Figure 20:
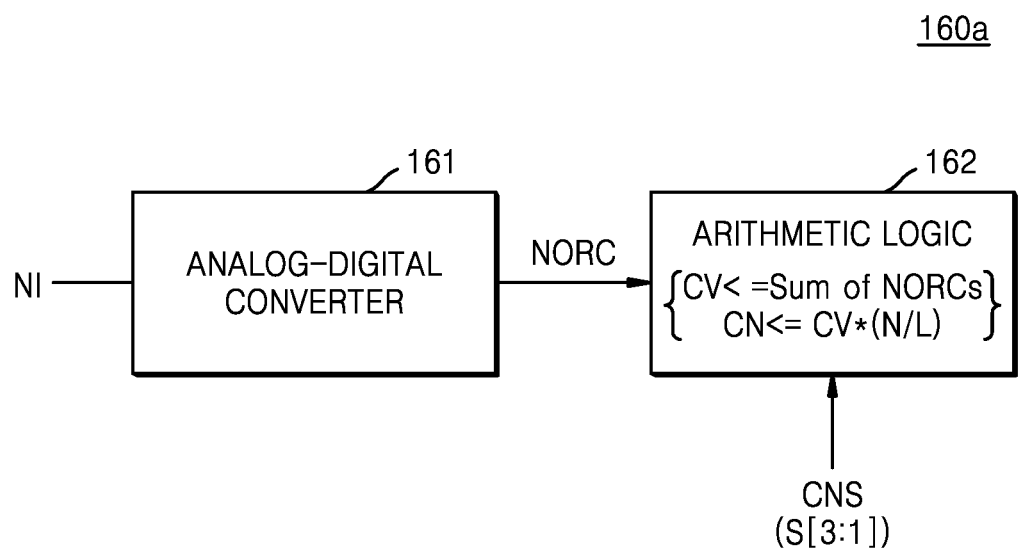
FIG. 20 is a block diagram of an example of another fail bit counter according to an embodiment.

FIG. 20 is a block diagram of an example of another fail bit counter according to an embodiment.

Referring to FIG. 20, the fail bit counter may include an analog-digital converter 161 (hereinafter, referred to as the ADC) and an arithmetic logic 162. The ADC 161 may convert analog signals received from an input node NI, for example, current signals, into digital signals. The digital signals may be expressed as count values of fail bits. The ADC 161 may count K bits at most based on input signals. For example, when K is 16, the ADC 161 may convert input signals into 4-bit digital signals and may accordingly count 16 bits at most.

In the page buffer array included in the page buffer unit 150, the ADC 161 may count fail bits of selected columns in each row and may provide the arithmetic logic 162 with row count values NORC according to a count value of the fail bits of the selected columns.

The arithmetic logic 162 may generate a count value CV regarding the page buffer array by combining the row count values NORC provided by the ADC 161 and may calculate fail bit values CN of the page buffer unit 150 by multiplying the count value CV and a sampling ratio (N/L). In this case, the arithmetic logic 162 may determine a sampling ratio (V/L) based on data values of a control signal CNS.

FIG. 21 is a table showing the maximum possible number of fail bits that may be counted according to a column sampling ratio according to a column sampling ratio, according to an embodiment.

In the table of FIG. 21, N indicates the number of columns included in a page buffer array PBAR of the page buffer unit 150 (of FIG. 1). A indicates the number of columns included in first column groups. B indicates the number of columns included in second column groups. C indicates the number of columns included in third column groups. When the fail bit counter 160 counts K bits at most at a time and the number of rows included in the page buffer array PBAR is M, the maximum number of counted fail bits according to each column sampling ratio may be K*M*the column sampling ratio. As the column sampling ratio is high, in other words, as the number of selected columns is small, the maximum number of counted fail bit may be increased. As described above, since the accuracy of the fail bit values decreases when the column sampling ratio is high, the column sampling ratio may be determined in consideration of scattering characteristics of program states, program times, etc. according to operation modes.

Figure 22:
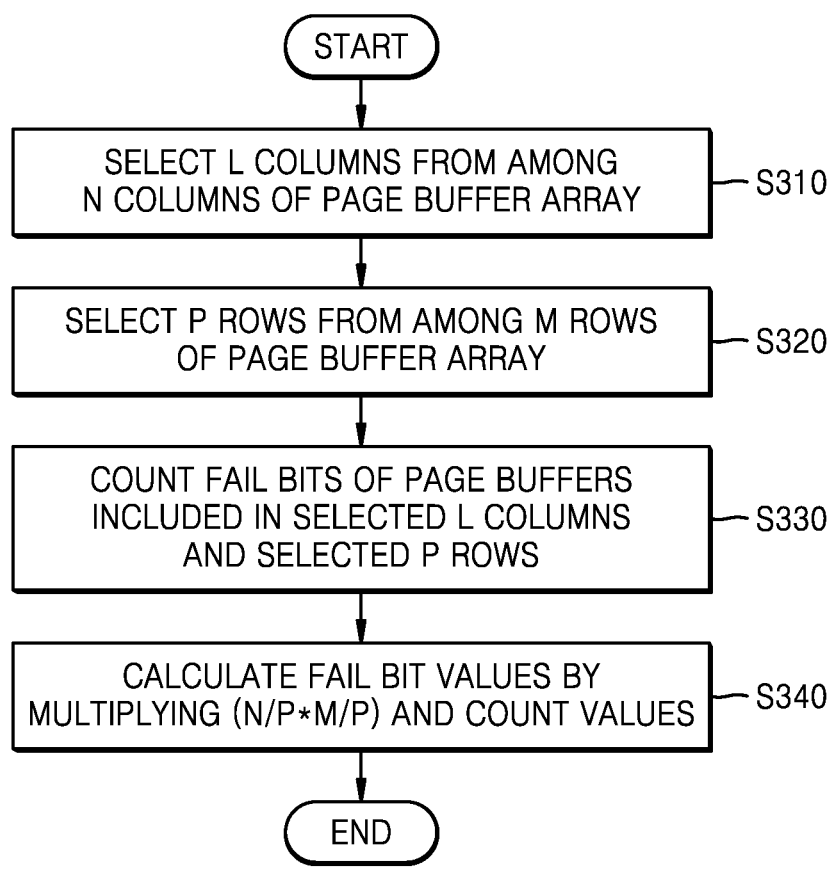
FIG. 22 is a flowchart of another method of counting fail bits according to an embodiment.

FIG. 22 is a flowchart of another method of counting fail bits according to an embodiment.

Referring to FIG. 22, the control logic 120 (of FIG. 1) may select L columns from among N columns included in a page buffer array in operation S310 and may select P rows from among M rows included in the page buffer array in operation S320.

The fail bit counter 160 may count fail bits of page buffers included in the selected L columns and P rows (where, P is an integer equal to or greater than 2, but is less than or equal to L) in operation S330. In other words, the fail bit counter 160 may count fail bits of page buffers selected through column sampling and row sampling.

The fail bit counter 160 may calculate a fail bit value by multiplying the counted number of fail bits, a column sampling ratio (N/L), and a row sampling ratio (M/P).

Figure 23A:
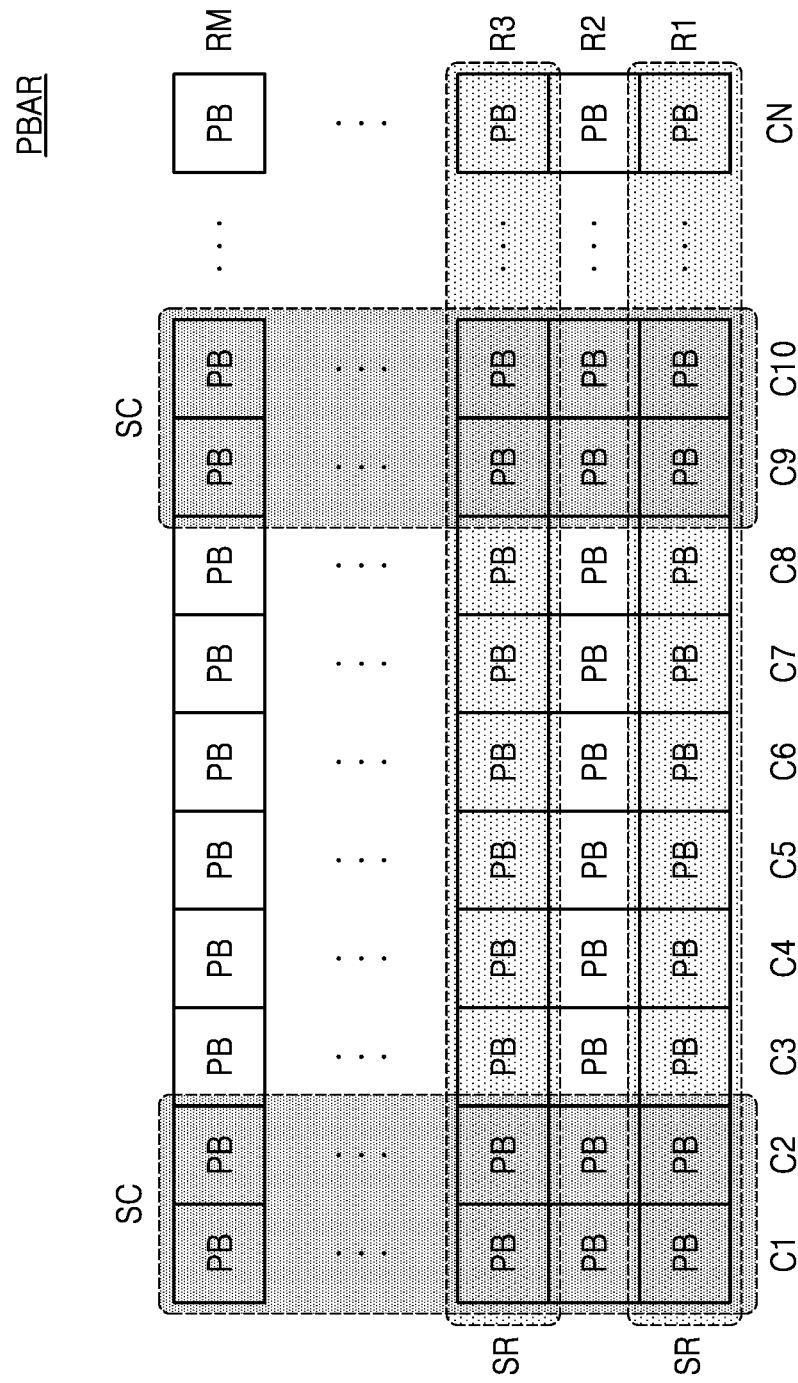
FIG. 23A shows columns and rows selected from among columns and rows included in a page buffer array.
Figure 23B:
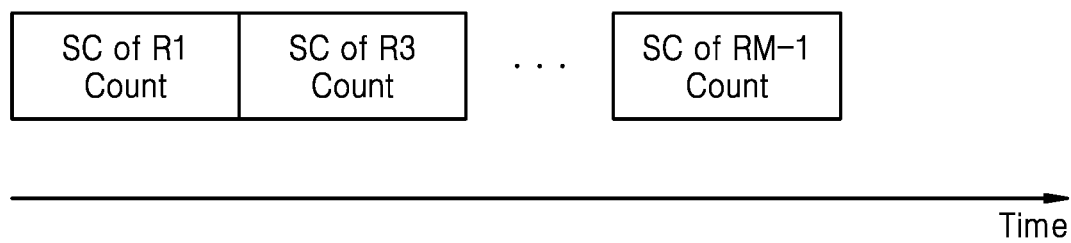
FIG. 23B temporally shows an operation of counting fail bits of a page buffer included in the selected columns and rows of FIG. 23A.

FIG. 23A shows columns and rows selected from among columns and rows included in a page buffer array, and FIG. 23B temporally shows an operation of counting fail bits of a page buffer included in the selected columns SC and rows SR of FIG. 23A.

Referring to FIG. 23A, some columns may be selected from among first to $n^{th}$ columns C1 to CN, and for example, as shown in FIG. 23A, two of every eight columns may be selected. Also, some rows may be selected from among first to $M^{th}$ rows R1 to RM, and for example, as shown in FIG. 23A, odd rows may be selected. However, the mechanisms for selecting columns and rows is not limited thereto, and columns and rows may be variously selected.

Referring to FIG. 23B, the fail bit counter 160 may count fail bits included in selected columns SC of each of the selected rows. As shown in FIG. 23B, the fail bit counter 160 may count fail bits included in selected columns SC of a first row R1 and then fail bits included in selected columns SC of a third row R3. When M is an even number, the fail bit counter 160 may sequentially count fail bits from the selected columns SC of the first row R1 to selected columns SC of an M−1 row RM−1. Since the fail bits are counted through row sampling, a counting time may decrease. As shown in FIG. 23B, when fail bits included in selected half of the entire row R1 to RM are counted, the counting time may be half of a time taken to count fail bits included in the entire row R1 to RM.

In another embodiment, top or bottom half may be selected from among the rows R1 to RM. For example, the first to M/2 rows R1 to RM/2 may be selected. The fail bit counter 160 may count fail bits from the selected columns SC of the first row R1 to selected columns SC of the M/2 row RM/2.

As described with reference to FIGS. 22 to 23B, when a fail bit value is calculated through row sampling, a row sampling ratio is not related to the calculated fail bit value at all. However, the row sampling ratio is high, a counting time may decrease.

Figure 24:
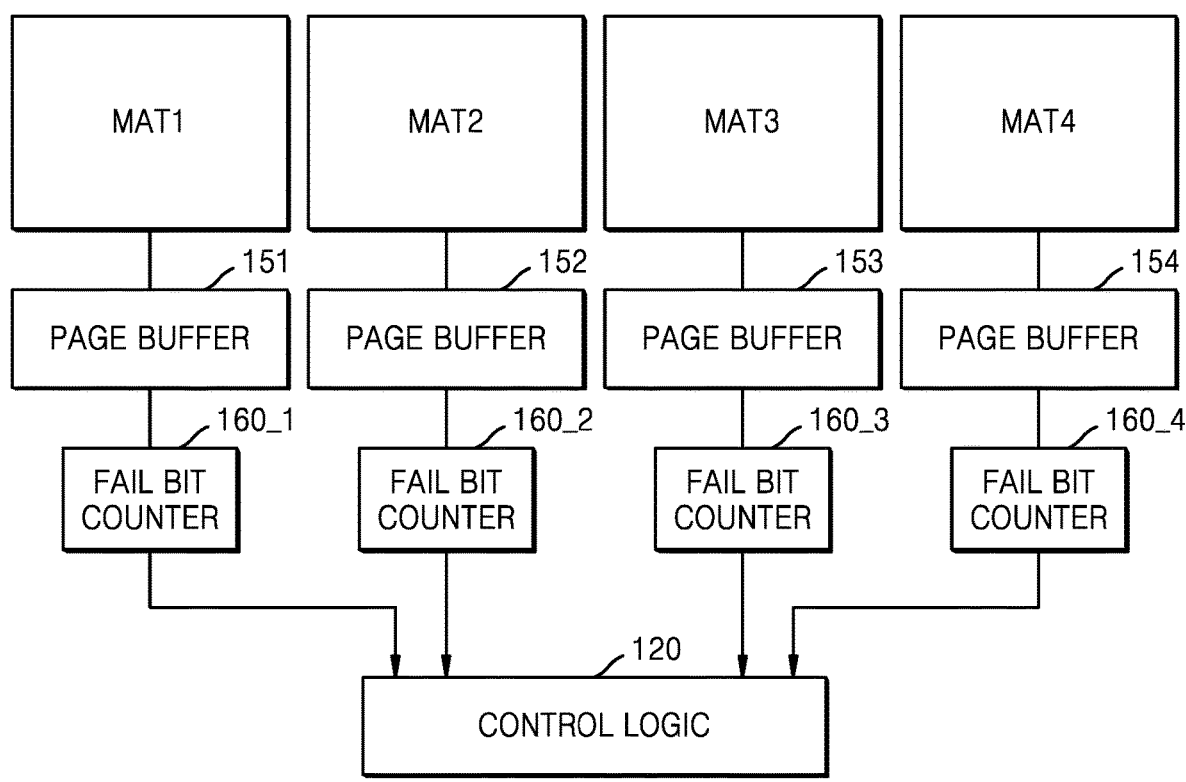
FIG. 24 is a block diagram of another memory device according to an embodiment.

FIG. 24 is a block diagram of another memory device according to an embodiment.

Referring to FIG. 24, a memory device 100a may include cell arrays MAT1, MAT2, MAT3, and MAT4, page buffers 151 to 154 respectively connected to the cell arrays MAT1, MAT2, MAT3, and MAT4, and fail bit counters 160_1 to 160_4 respectively connected to the page buffers 151 to 154. Also, the memory device 100a may include the control logic 120 and may further include the components described with reference to FIG. 1.

For example, when it is assumed that the page buffers 151 to 154 may each be 4 KB, a page buffer array included in each of the page buffers 151 to 154 includes 16 rows, and each of the fail bit counters 160_1 to 160_4 counts 16 bits at most at a time, the maximum number of fail bits counted by the fail bit counters 160_1 to 160_4 may be 1024 bits (16 bits*16 rows*4=1024 bits). However, as described with reference to FIGS. 11 to 23B, when fail bits are counted by using a column sampling method according to embodiments, the maximum possible number of fail bits which may be counted may be increased.

Figure 25:
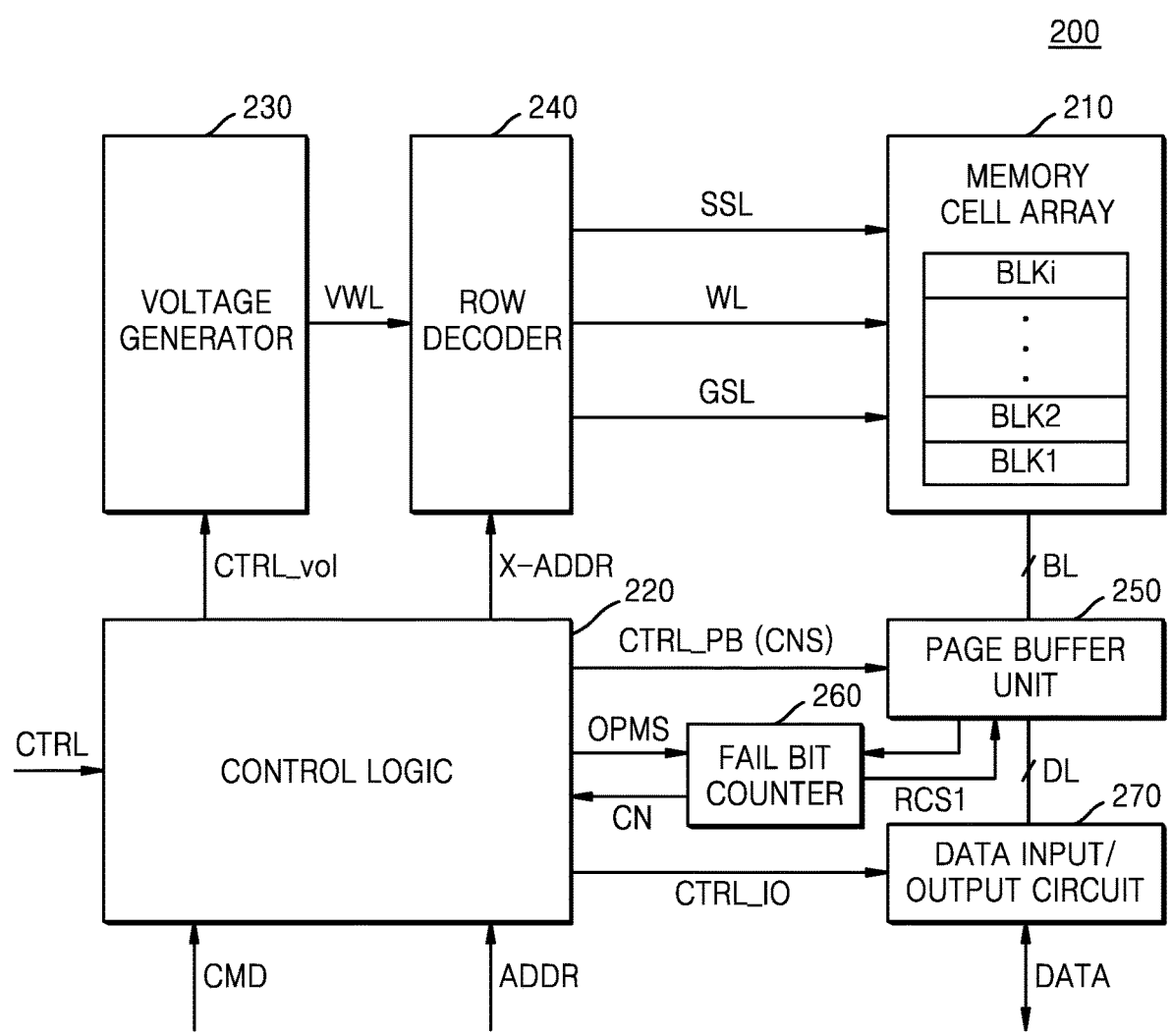
FIG. 25 is a schematic block diagram of a memory device according to an embodiment.

FIG. 25 is a schematic block diagram of a memory device 200 according to an embodiment.

Referring to FIG. 25, the memory device 200 may include a memory cell array 210, a control logic 220, a voltage generator 230, a row decoder 240, a page buffer unit 250, a fail bit counter 260, and a data input/output circuit 270.

Structures and operations of the memory cell array 210, the control logic 220, the voltage generator 230, the row decoder 240, the page buffer unit 250, the fail bit counter 260, and the data input/output circuit 270 of the memory device 200 may be substantially the same or similar to the structures and operations of the memory cell array 110, the control logic 120, the voltage generator 130, the row decoder 140, the page buffer unit 150, the fail bit counter 160, and the data input/output circuit 170 of the memory device 100 of FIG. 1. Thus, descriptions of the components of the memory device 100 with reference to FIGS. 1 through 24 may be applied to the memory device 200, unless the descriptions contradict descriptions of the memory device 200 according to the present embodiment.

The page buffer unit 250 may include a page buffer array including a plurality of page buffers arranged in a matrix form. With respect to each of a plurality of operation modes (for example, an SLC write mode, an MLC write mode, a TLC write mode, etc.), columns in which fail bits are to be counted (or fail bits are to be detected) may be determined, from among a plurality of columns of the page buffer array. Hereinafter, the columns in which the fail bits are to be counted (or the columns in which the fail bits are to be detected) will be referred to as first columns.

For example, the first columns determined according to the operation mode, from among the plurality of columns of the page buffer array, may be connected to the fail bit counter 260 or the fail bits stored in page buffers included in the first columns may be detected, and a signal indicating a result of the detection may be provided to the fail bit counter 260. Thus, the fail bit counter 260 may count the fail bits stored in the page buffers included in the first columns.

According to an embodiment, the first columns may be predetermined with respect to each of the plurality of operation modes, before performing an operation of writing data in memory cells of the memory cell array 210. For example, the first columns may be predetermined with respect to each of the operation modes, such as the write modes (for example, an SLC write mode, an MLC write mode, and a TLC write mode) based on the number of data bits stored in the memory cell, an erase mode, etc.

The number of first columns, or a column sampling ratio (i.e., a ratio of the number of all columns of the page buffer array to the number of the first columns), may vary based on the plurality of operation modes. For example, the number of first columns when the operation mode is the SLC write mode may be different from the number of first columns when the operation mode is the TLC write mode. The page buffer unit 250 may detect the fail bits stored in the page buffers included in the predetermined first columns and may provide an output signal corresponding to the number of detected fail bits to the fail bit counter 260.

According to an embodiment, the page buffer unit 250 may detect the fail bits based on a first reference current. The amount of current of the first reference current may indicate one fail bit, and the page buffer unit 250 may output, to the fail bit counter 260, a current corresponding to a multiple of the first reference current given by the number of fail bits that are detected. According to an embodiment, the page buffer unit 250 may generate the first reference current based on a first reference current signal RCS1 received from the fail bit counter 260.

The fail bit counter 260 may count the fail bits based on the output signal received from the page buffer unit 250. The fail bit counter 260 may count the fail bits stored in the page buffers included in the first columns determined according to the operation mode, from among the plurality of columns of the page buffer array. The fail bit counter 260 may provide a result of the counting operation, that is, a counted value to the control logic 220 as the fail bit value CN.

The fail bit counter 260 may count the fail bits based on a second reference current and may adjust the first reference current and the second reference current. The fail bit counter 260 may adjust at least one reference current, for example, the first reference current or the second reference current, according to the plurality of operation modes. According to an embodiment, a current ratio of the second reference current to the first reference current may be differently determined with respect to each of the plurality of operation modes, and the fail bit counter 260 may receive an operation mode signal OPMS provided from the control logic 220 and adjust at least one of the first reference current and the second reference current such that the current ratio of the second reference current to the first reference current corresponds to a current ratio indicated by the operation mode signal OPMS. As the current ratio is increased, the maximum number of counted bits of the fail bit counter 260, that is, the maximum number of bits that may be counted by the fail bit counter 260 by an operation may be increased.

For example, the current ratio of the second reference current to the first reference current in the SLC operation mode may be determined to be greater than the current ratio of the second reference current to the first reference current in the TLC operation mode. Thus, the maximum number of counted bits of the fail bit counter 260 in the SLC operation mode may be greater than the maximum number of counted bits of the fail bit counter 260 in the TLC operation mode.

U.S. Patent Publication No. 2017/0117055 discloses in detail the fail bit counter 260 configured to adjust the maximum number of counted bits by adjusting the reference current, and appropriate configurations of the page buffer unit 250, and is incorporated herein by reference.

The control logic 220 may determine whether a program has passed/failed based on the fail bit value CN and a reference count. The control logic 220 may compare the fail bit value CN with the reference count. When the fail bit value CN is equal to or less than the reference count, the control logic 220 may determine that the program has passed, and when the fail bit value CN is greater than the reference count, the control logic 220 may determine that the program has failed. The reference count may be differently determined with respect to the plurality of operation modes.

According to the present embodiment, that it is determined that the program has passed denotes that it is determined that the program has passed due to an operation of applying the program voltage, which is simultaneously performed with the operation of counting the fail bits by the fail bit counter 260. Thus, when it is determined that the program has passed, the verification operation (or the verification read operation) after applying the program voltage to the word line may be skipped. Here, the operation of applying the program voltage may be performed simultaneously with or after the operation of counting the fail bits.

Figure 26:
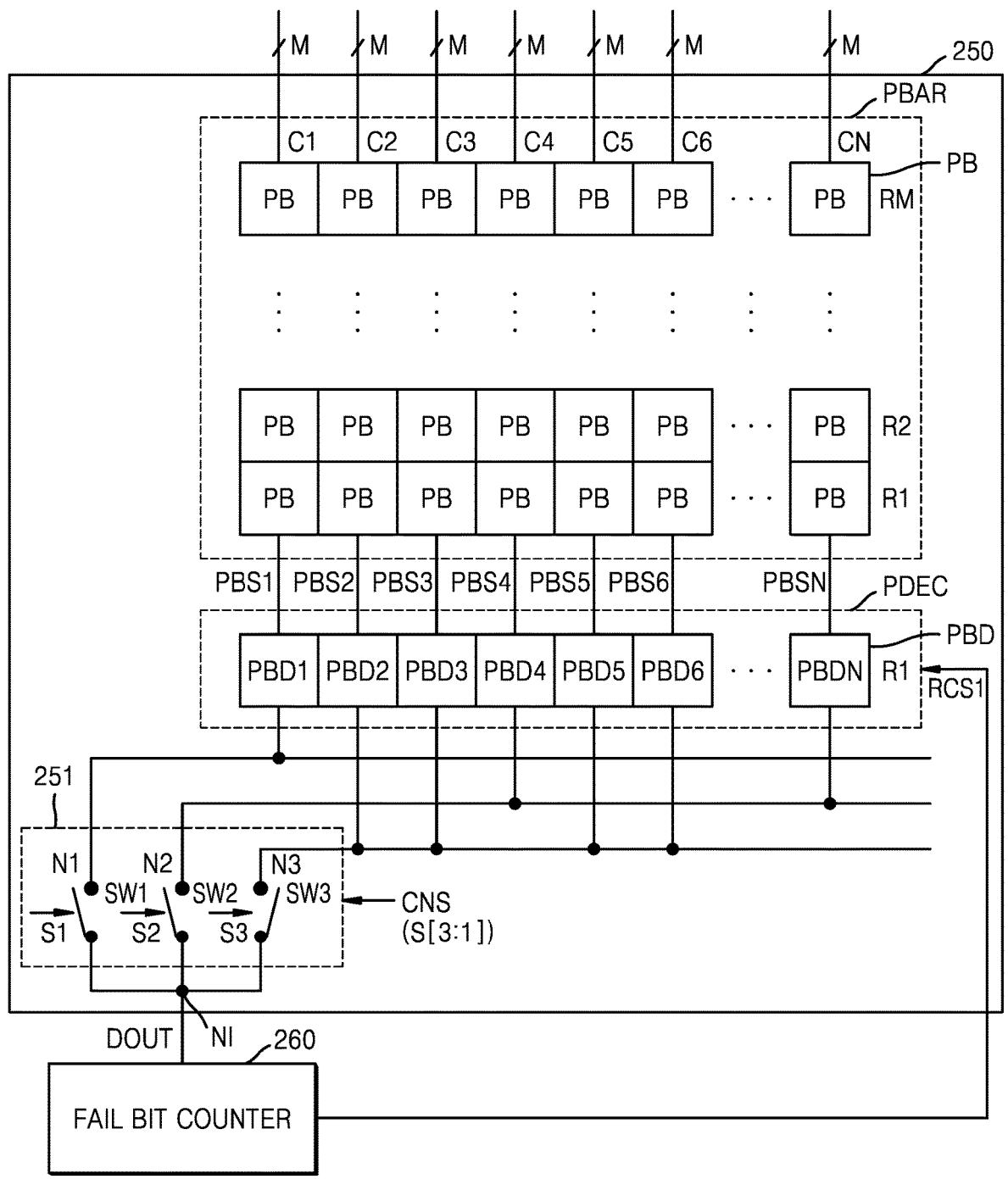
FIG. 26 is a diagram of an example of a page buffer unit according to an embodiment.

FIG. 26 is a diagram of an example of the page buffer unit 250 according to an embodiment. For convenience of explanation, the fail bit counter 260 is illustrated together.

Referring to FIG. 26, the page buffer unit 250 may include a page buffer array PBAR, a page buffer decoding unit PDEC, and a connection circuit 251. The page buffer array PBAR may include a plurality of page buffers PB arranged in a matrix form and may correspond to the page buffer array PBAR of FIG. 11 or the sub array SUBA of FIG. 16. The page buffer array PBAR may include N columns C1 through CN and M rows R1 through RM.

The page buffer decoding unit PDEC may include N page buffer decoders PBD1 through PBDN, and the N page buffer decoders PBD1 through PBDN may be connected to the N columns C1 through CN of the page buffer array PBAR, respectively, and may receive page buffer signals (for example, PBS1 through PBSN) from the columns connected thereto. The page buffer signals may indicate whether pass bits or fail bits are stored in the page buffers PB.

For example, the first page buffer decoder PBD1 may be connected to the first column C1 of the page buffer array PBAR and may receive the first page buffer signal PBS1 from the first column C1. When the first page buffer signal PBS1 indicates a fail bit, the first page buffer decoder PBD1 may sink (or source) a first reference current based on a first reference current signal RCS1. When the first page buffer signal PBS1 indicates a pass bit, the output of the first page buffer decoder PBD1 may be floated. Operations of the second through $N^{th}$ page buffer decoders PBD2 through PBDN may be substantially the same as the operation of the first page buffer decoder PBD1.

Each of the first through $N^{th}$ page buffer decoders PBD1 through PBDN may be connected to a plurality of sensing nodes, for example, one of first through third sensing nodes N1 through N3, and may be connected to the fail bit counter 260 by a switching operation of the connection circuit 251 based on a connection control signal CNS. FIG. 26 illustrates that the number of page buffer decoders connected to each of the plurality of sensing nodes is different. However, the inventive concept is not limited thereto, and the number of page buffer decoders connected to each of the plurality of sensing nodes may be the same. Currents corresponding to multiple first reference currents in correspondence to the number of fail bits detected by the page buffer decoders connected to the fail bit counter 260 may be provided to the fail bit counter 260 as a decoder output signal DOUT. The decoder output signal DOUT may be an analog signal corresponding to one row of M rows R1 through RM of the page buffer array PBAR, and a plurality of decoder output signals DOUTs corresponding to the M rows R1 through RM (or one or more of N rows), respectively, may be sequentially provided to the fail bit counter 260.

The connection control signal CNS may be differently determined based on the plurality of operation modes. For example, in the SLC operation mode, the connection control signal may be '001' and in the TLC operation mode, the connection control signal CNS may be '111.' Thus, L first columns determined based on the operation mode from among the N columns C1 through CN of the page buffer array PBAR may be connected to the fail bit counter 260, and thus, fail bits may be counted, wherein L may vary according to the operation modes.

Meanwhile, the present embodiment illustrates the example in which that the L first columns in which the fail bits are to be counted are determined based on the connection control signal CNS determined based on the operation mode. However, the inventive concept is not limited thereto. According to an embodiment, all of the first through $N^{th}$ page buffer decoders PBD1 through PBDN may be connected to the fail bit counter 260 and only activated page buffer decoders may vary according to the plurality of operation modes. For example, L page buffer decoders from among the first through $N^{th}$ page buffer decoders PBD1 through PBDN may be activated based on a page buffer control signal (CTRL_PB of FIG. 27) received from the control logic 220, so that the fail bits of the L first columns corresponding to the activated L page buffer decoders may be counted.

Figure 27:
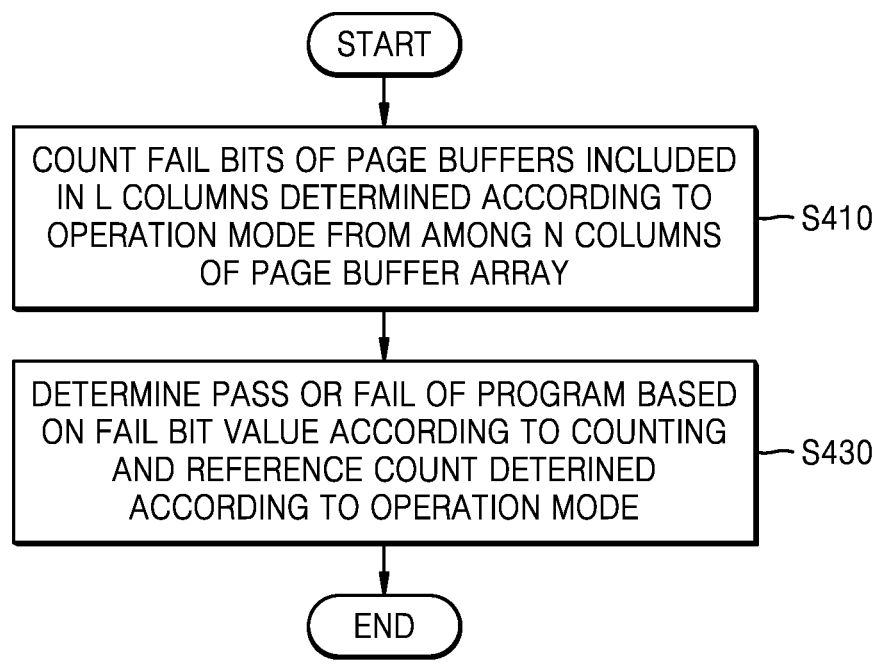
FIG. 27 is a flowchart of a method of determining whether a program has passed/failed, according to an embodiment.

FIG. 27 is a flowchart of a method of determining whether a program has passed/failed, according to an embodiment. The method of FIG. 27 may be performed by the memory device 200 of FIG. 25 and may be performed during an operation of programming the memory cells.

Referring to FIGS. 25 and 27, the fail bit counter 260 may count the fail bits of the page buffers included in N columns of the page buffer array, that is, L columns from among the total columns, which are determined based on the operation mode, that is, the first columns (S410). The L first columns may be predetermined before the program operation is performed and may be differently determined with respect to the plurality of operation modes. That is, L may vary according to the plurality of operation modes.

The fail bit counter 260 may receive current corresponding to a multiple first reference current given by the number of fail bits detected, as the decoder output signal DOUT of the page buffer unit 250, and may count the fail bits based on the second reference current.

The control logic 220 may receive the fail bit value CN based on the counting operation from the fail bit counter 260 and may determine whether the program has passed/failed based on the reference count determined according to the operation mode and the fail bit value CN (S430). According to an embodiment, the fail bit value CN and the reference count may be indicated as a first data code and a second data code including the same number of bits, and the control logic 220 may determine whether the program has passed/ failed by comparing the first data code and the second data code corresponding to the fail bit value CN and the reference count, respectively.

FIG. 28 is a diagram of examples of parameters determined according to the plurality of operation modes in a memory device, according to an embodiment.

Referring to FIG. 28, an operation mode OPM may include, for example, a first operation mode OP1, a second operation mode OP2, and a third operation mode OP3, wherein the first operation mode OP1 may indicate an SLC write mode, the second operation mode OP2 may indicate an MLC write mode, and the third operation mode OP3 may indicate a TLC write mode.

The parameters for counting the fail bits or determining whether the program has passed/failed may be determined based on the operation mode. For example, the parameters may include a connection control signal CNS, a reference count, and a current ratio m (m is a positive integer) of a second reference current RC2 to a first reference current RC1. The connection control signal CNS and the current ratio m may be determined for each of the first operation mode OP1, the second operation mode OP2, and the third operation mode OP3.

For example, the connection control signal CNS may be determined for each of the first operation mode OP1, the second operation mode OP2, and the third operation mode OP3, and the connection control signal CNS may be differently determined based on the operation mode OPM. Also, a first reference count RCT1, a second reference count RCT2, and a third reference count RCT3 may be determined for the first operation mode OP1, the second operation mode OP2, and the third operation mode OP3, respectively, and the first through third reference counts RCT1 through RCT3 may be different from one another. However, the inventive concept is not limited thereto, and at least two of the first through third reference counts RCT1 through RCT3 may be determined to be the same. The current ratio m may be determined for each of the first through third operation modes OP1 through OP3, and as illustrated in FIG. 28, the current ratio m may be differently determined based on the operation mode OPMs.

Figure 29:
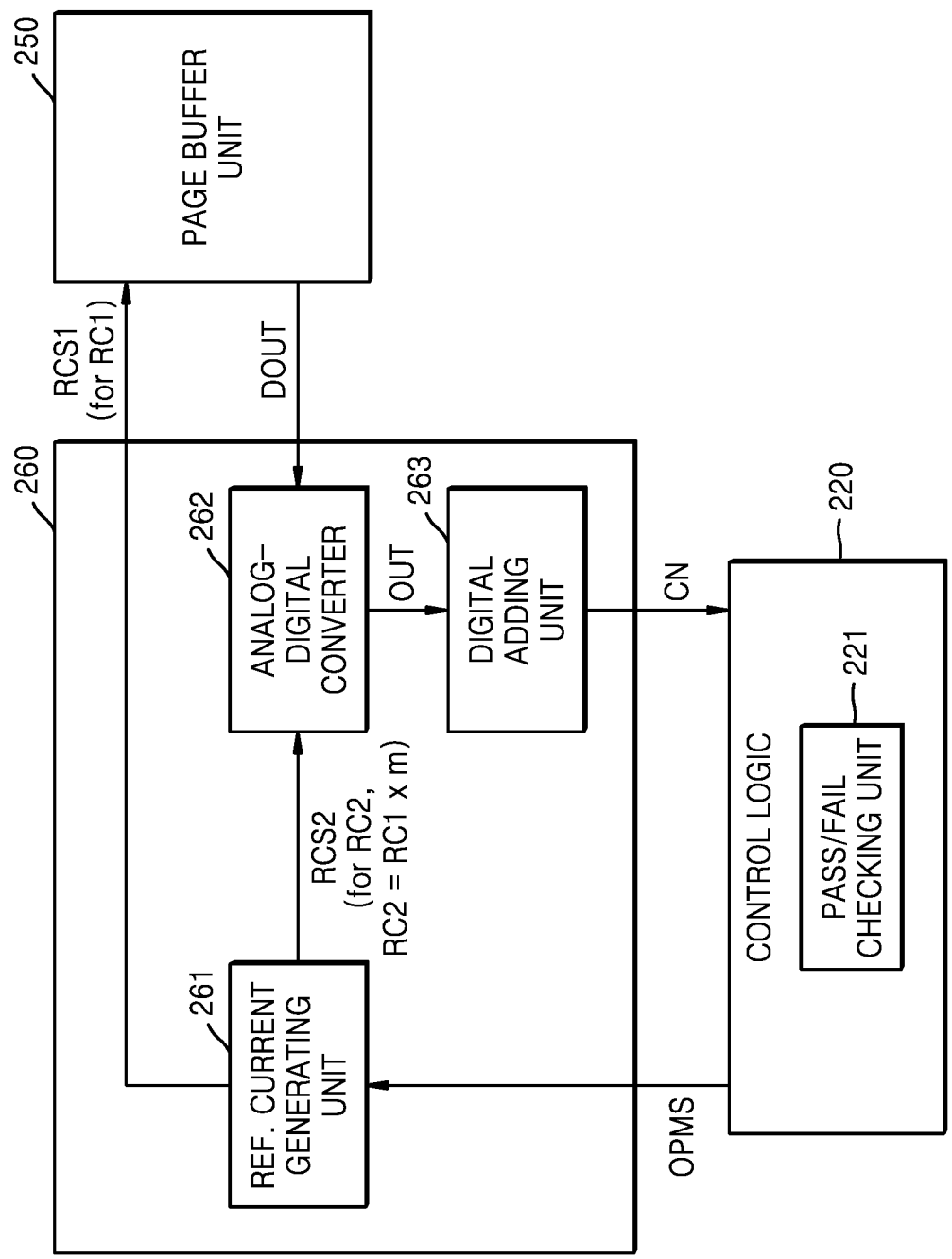
FIG. 29 is a block diagram of an example of a fail bit counter according to an embodiment.

FIG. 29 is a block diagram of an example of the fail bit counter 260 according to an embodiment.

Referring to FIG. 29, the fail bit counter 260 may include a reference current generator 261, an analog-to-digital converter 262, and a digital adder 263.

The reference current generator 261 may generate a first reference current signal RCS1 and a second reference current signal RCS2 based on the operation mode OPM provided from the control logic 220. The first reference current signal RCS1 may be provided to the page buffer unit 250, and the page buffer decoding unit PDEC provided in the page buffer unit 250 may generate the first reference current RC1 based on the first reference current signal RCS1 and may generate the decoder output signal DOUT corresponding to the number of fail bits, based on the first reference current RC1.

The analog-to-digital converter 262 may generate the second reference current RC2 based on the second reference current signal RCS2 and may output a row count result OUT corresponding to the number of fail bits from the decoder output signal DOUT based on the second reference current RC2. As described with reference to FIG. 26, the decoder output signal DOUT may be a signal corresponding to one of the plurality of rows of the page buffer array and the plurality of output signals DOUT respectively corresponding to the plurality of rows (or one or more of the plurality of rows) may be sequentially provided to the fail bit counter 260. Thus, the analog-to-digital converter 262 may sequentially generate a plurality of row count results OUT.

Meanwhile, as described with reference to FIG. 28, the current ratio m of the second reference current RC2 to the first reference current RC1 may be determined based on the operation mode OPM. The reference current generator 261 may adjust the first reference current RC1 and/or the second reference current RC2 based on an operation mode signal OPMS received from the control logic 220. Thus, the current ratio m of the second reference current RC2 to the first reference current RC1 may have a predetermined value.

The digital adder 263 may add the plurality of row count results OUT received from the analog-to-digital converter 262. The digital adder 263 may provide the added value, that is, the count result, to the control logic 220, as the fail bit value CN.

The control logic 220 may include a pass/fail checking unit 221, and the pass/fail checking unit 221 may compare the fail bit value CN with the reference count to determine whether the program has passed/failed. As described above, the reference count may be determined based on the operation mode OPM, and the reference count may vary according to the plurality of operation modes OPMs.

Figure 30:
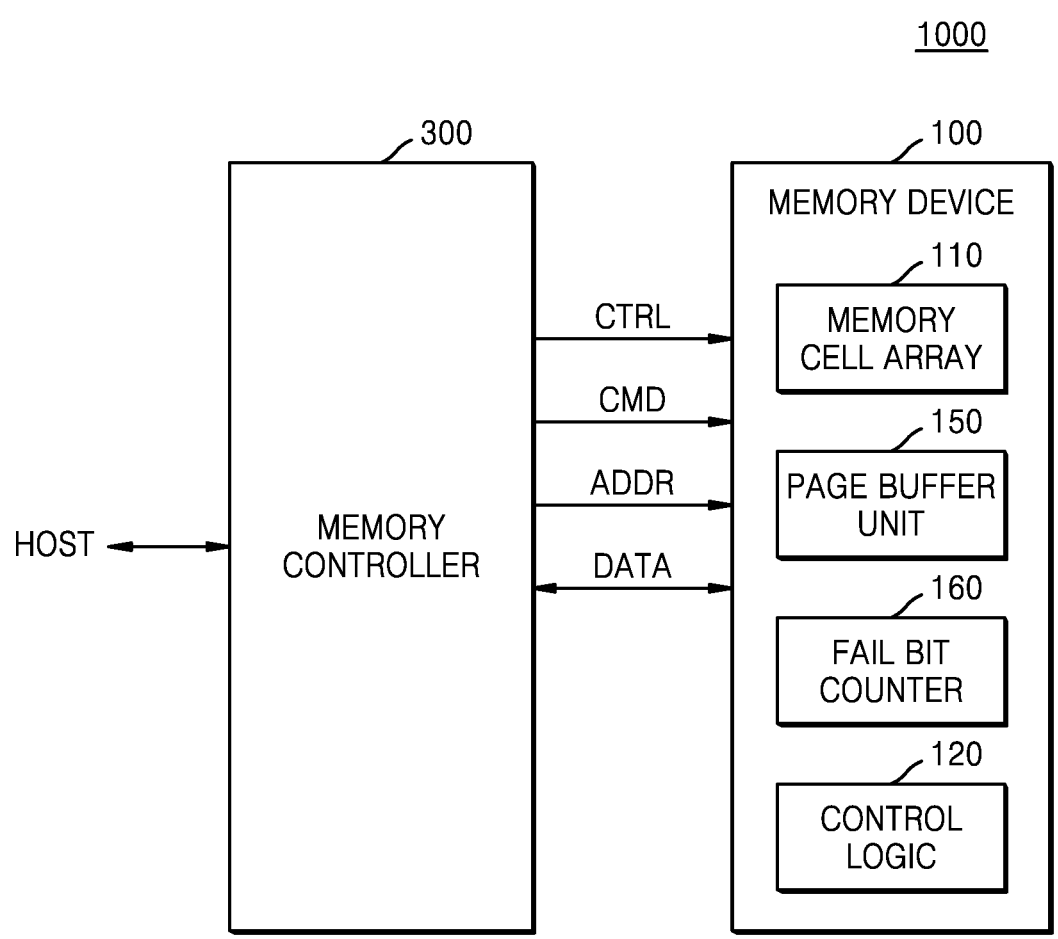
FIG. 30 is a block diagram of a memory system according to an embodiment.
Figure 31:
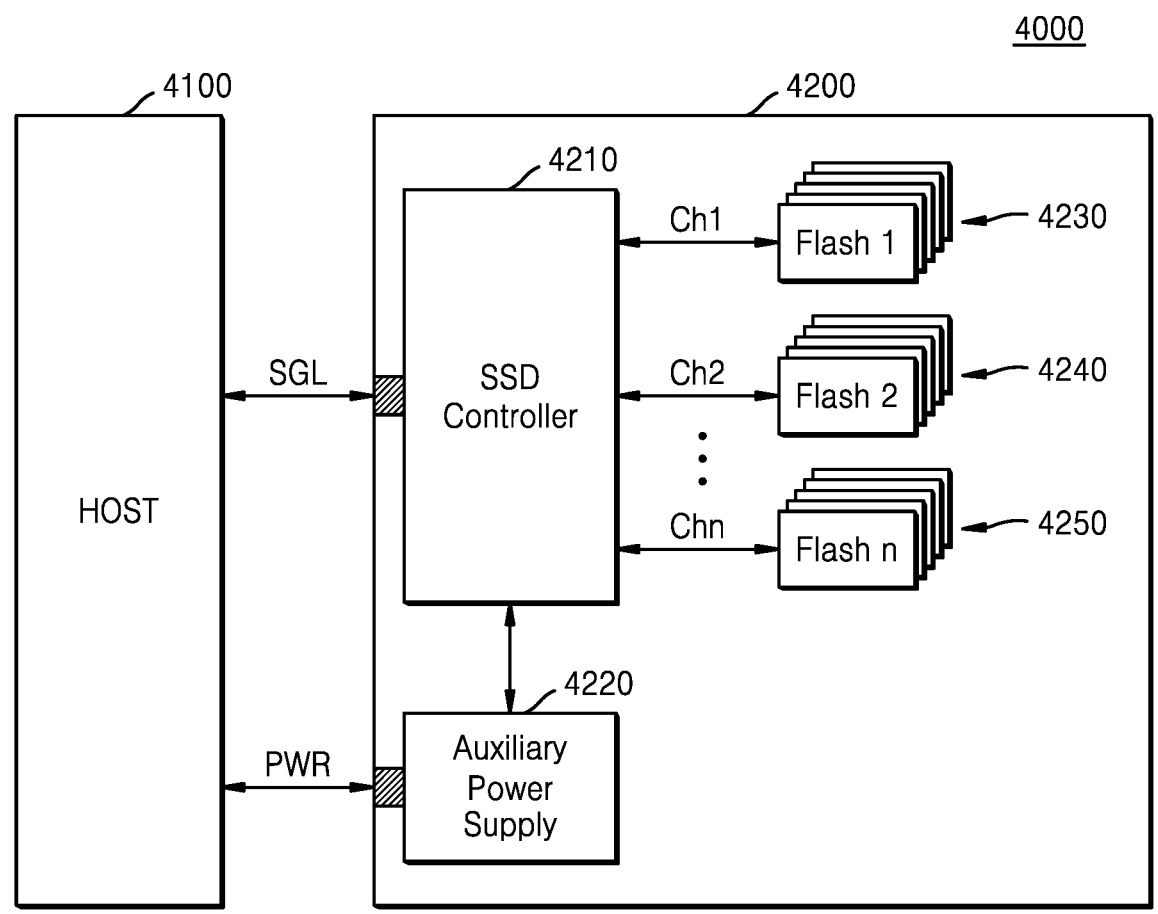
FIG. 31 is a block diagram of a solid state disk (SSD) system according to an embodiment.

FIG. 30 is a block diagram of a memory system 1000 according to an embodiment.

The memory system 1000 may be mounted in electronic devices such as a computer, a laptop, a mobile phone, a smart phone, an MP3 player, a Personal Digital Assistants (PDA), a Portable Multimedia Player (PMP), a digital TV, a digital camera, and a portable game console.

Referring to FIG. 30, the memory system 1000 may include the memory device 100 and a memory controller 300. The memory device 100 may include the memory cell array 110, the page buffer unit 150, the fail bit counter 160, and the control logic 120. The memory device 200 of FIG. 25 may be applied to the memory system 1000.

The memory controller 300 may control the memory device to read data stored in the memory device 100 or write data thereto in response to a read/write request from a host HOST. In detail, the memory controller 300 may control program (or write), read, and erase operations regarding the memory device 100 by providing the memory device 100 with an address ADDR, a command CMD, and a control signal CTRL. The memory controller 200 may transmit data DATA used for a program operation to the memory device 100. The memory controller 200 may provide the memory device 100 with data DATA having a size corresponding to a program unit of the memory device 100, an address ADDR in which data DATA is stored, and a command CMD indicating the write request.

Although not shown, the memory controller 300 may include a RAM, a processing unit, a host interface, and a memory interface. The RAM may be used as an operation memory of the processing unit, and the processing unit may control operations of the memory controller 300. The host interface may include protocols for exchanging data between the host HOST and the memory controller 300. For example, the memory controller 200 may be configured to communicate with the outside, that is, the host HOST, via at least one of various interface protocols such as a Universal Serial Bus (USB), a Multimedia Card (MMC), peripheral Component Interconnect Express (PCI-E), Advanced Technology Attachment (ATA), Serial-ATA, Parallel-ATA, a Small Computer System Interface (SCSI), an Enhanced Small Device Interface (ESDI), and Integrated Drive Electronics (IDE).

Components of the memory device 100 are already described with reference to FIG. 1, and thus repeated descriptions will be omitted. As described with reference to FIG. 15, the control logic 120 may set levels of operation voltages to be applied to the memory cell array 110 according to an operation mode indicated by the command CMD received from the memory controller 200. The control logic 120 may also provide the page buffer unit 150 with a signal, for example, a connection control signal, for selecting at least one of column groups of the page buffer array of the page buffer unit 150. After the program operation and the verification operation are performed on the memory cells, the fail bit counter 160 may count fail bits included in the at least one selected column group and may calculate a fail bit value by multiplying the counted fail bits and a column sampling ratio. The control logic 120 may not perform the verification operation after an additional program operation when the fail bit value is less than or equal to a threshold value that is set in advance. Accordingly, the memory device 100 may skip one verification operation for each program state, and thus program speed may increase. Also, operation speed of the memory system 1000 may be improved.

FIG. 26 is a block diagram of a solid state disk (SSD) system 4000 according to an embodiment.

Referring to FIG. 26, the SSD system 4000 may include a host 4100 and an SSD 4200. The SSD 4200 exchanges signals with the host 4100 through a signal connector and receives power from a power connector.

The SSD 4200 may include an SSD controller 4210, an auxiliary power supply 4220, and memory devices 4230, 4240, and 4250. The memory devices 4230, 4240, and 4250 may be NAND flash memory devices of a vertical-stack type. However, the memory devices 4230, 4240 and 4250 are not limited thereto, and at least one of the memory devices 4230, 4240, and 4250 may be a memory device of a planar type.

At least one of the memory devices 4230, 4240, and 4250 may include the memory device 100 described with reference to FIG. 1 or the memory device 200 described with reference to FIG. 25. Accordingly, a data program time of a memory device may be reduced, and thus performance characteristics of the SSD 4200 may be improved.

A non-volatile memory device, and a memory controller, a memory system and a solid state disk (SSD) according to embodiments may be mounted by using various types of packages. For example, a flash memory device and/or a memory controller may be mounted by using packages such as a Package on Package (PoP), Ball grid arrays (BGAs), Chip Scale Packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), Small Outline (SOIC), a Shrink Small Outline Package (SSOP), a Thin Small Outline (TSOP), a System In Package (SIP), a Multi Chip Package (MCP), a Wafer-level Fabricated Package (WFP), and a Wafer-Level Processed Stack Package (WSP).

What is claimed is:

1. An operating method of a nonvolatile memory device comprising a page buffer array in which a plurality of page buffers are arranged in a matrix form, the operating method comprising:

counting fail hits stored in the page buffers included in first columns determined based on an operation mode from among a plurality of columns of the page buffer array; and determining whether or not a program has passed with respect to memory cells to which the page buffer array is connected, based on a count result corresponding to a number of the fail bits and a reference count determined based on the operation mode.

2. The operating method of claim 1, wherein the first columns and the reference count based on the operation mode is predetermined before a program operation with respect to the memory cells is performed.

3. The operating method of claim 1, wherein a number of the first columns varies according to a plurality of operation modes.

4. The operating method of claim 3, wherein the plurality of operation modes comprise write modes according to the number of data bits stored in each of the memory cells.

5. The operating method of claim 3, wherein a number of the first columns determined according to a single level cell write mode from among the plurality of operation modes is greater than a number of the first columns determined according to a multi-level cell write mode.

6. The operating method of claim 1, wherein the reference count is determined as a first value according to a first operation mode,
the reference count is determined as a second value according to a second operation mode, and
the first value and the second value are different from each other.

7. The operating method of claim 1, wherein the counting of the fail bits comprises counting the fail bits based on at least one reference current determined according to the operation mode, and
an amount of the at least one reference current varies according to a plurality of operation modes.

8. The operating method of claim 1, wherein the counting of the fail bits comprises:
generating an analog signal corresponding to the number of the fail bits based on a first reference current; and
generating the count result from the analog signal, based on a second reference current, and
the second reference current is m times (m is a positive integer) the first reference current, wherein m varies according to a plurality of operation modes.

9. The operating method of claim 1, wherein the nonvolatile memory device comprises a three-dimensional memory cell array.

10. The operating method of claim 9, wherein the three-dimensional memory cell array comprises a plurality of memory cells each comprising a charge trap layer.

11. An operating method of a nonvolatile memory device, the operating method comprising:
applying, to a word line of a memory cell array, a first program voltage for programming a plurality of memory cells connected to the word line to an $n^{th}$ program state (n is a positive integer);
performing a first verification operation corresponding to the operation of applying the first program voltage;
counting, based on a reference current, fail bits stored in page buffers included in L (L, is a positive integer equal to or less than N) columns predetermined based on a write mode, from among N (N is a positive integer) columns of a page buffer array connected to the plurality of memory cells; and
determining, based on a count result corresponding to a number of the fail bits and a reference count determined based on the write mode, whether a program has passed or not with respect to the plurality of memory cells.

12. The operating method of claim 11, wherein the L is differently predetermined with respect to each of a plurality of write modes according to a number of data bits stored in each of the plurality of memory cells.

13. The operating method of claim 12, wherein the reference count is differently predetermined with respect to each of the plurality of write modes.

14. The operating method of claim 12, wherein the counting of the fail bits comprises differently predetermining the reference current with respect to each of the plurality of write modes.

15. The operating method of claim 11, further comprising:
applying a second program voltage to the word line; and
when it is determined that the program has passed, programming at least one of the plurality of memory cells to an $n+1^{th}$ program state.

16. The operating method of claim 15, further comprising:
when it is determined that the program has passed, skipping a second verification operation corresponding to the operation of applying the second program voltage.

17. The operating method of claim 15, wherein a temporal section in which the second program voltage is applied overlaps a temporal section in which the counting operation is performed.

18. A nonvolatile memory device comprising:
a memory cell array comprising memory cells;
a page buffer array in which a plurality of page buffers are arranged in a matrix form and which is configured to generate a plurality of page buffer signals according to a result of a verification read operation on the memory cells;
a page buffer decoding unit configured to generate a decoder output signal corresponding to the number of fail bits from page buffer signals, from among the plurality of page buffer signals, the page buffer signals being received from first columns determined based on an operation mode from among a plurality of columns of the page buffer array;
a fail bit counter configured to output a count value corresponding to the number of fail bits from the decoder output signal; and
a control logic configured to determine whether or not a program has passed with respect to the memory cells, based on the count value, and a reference count determined based on the operation mode.

19. The nonvolatile memory device of claim 18, wherein the page buffer decoding unit is further configured to generate the decoder output signal based on a first reference current,
the fail hit counter is further configured to generate the count value based on a second reference current corresponding to in times the first reference current, and
the in is differently predetermined with respect to each of a plurality of operation m odes.

20. The nonvolatile memory device of claim 18, wherein a number of the first columns and the reference count are differently predetermined with respect to each of a plurality of operation modes.

* * * * *